United States Patent
Preikszas et al.

(10) Patent No.: US 10,755,889 B2
(45) Date of Patent: Aug. 25, 2020

(54) PARTICLE-OPTICAL APPARATUS AND PARTICLE BEAM SYSTEM

(71) Applicant: Carl Zeiss Microscopy GmbH, Jena (DE)

(72) Inventors: Dirk Preikszas, Oberkochen (DE); Bernd Hafner, Abtsgmuend (DE)

(73) Assignee: Carl Zeiss Microscopy GmbH, Jena (DE)

( * ) Notice: Subject to any disclaimer, the term of this patent is extended or adjusted under 35 U.S.C. 154(b) by 0 days.

(21) Appl. No.: 15/935,378

(22) Filed: Mar. 26, 2018

(65) Prior Publication Data
US 2018/0286625 A1  Oct. 4, 2018

(30) Foreign Application Priority Data

Mar. 28, 2017  (DE) .................. 10 2017 205 231

(51) Int. Cl.
*H01J 37/141*  (2006.01)
*H01J 37/147*  (2006.01)
*H01J 37/153*  (2006.01)

(52) U.S. Cl.
CPC .......... *H01J 37/141* (2013.01); *H01J 37/147* (2013.01); *H01J 37/153* (2013.01); *H01J 2237/063* (2013.01); *H01J 2237/08* (2013.01); *H01J 2237/083* (2013.01); *H01J 2237/141* (2013.01); *H01J 2237/1532* (2013.01)

(58) Field of Classification Search
None
See application file for complete search history.

(56) References Cited

U.S. PATENT DOCUMENTS

| 3,553,523 A | * | 1/1971 | Budd | .................... H01J 29/702 |
|---|---|---|---|---|
| | | | | 315/368.27 |
| 3,668,464 A | * | 6/1972 | Tokita | .................. H01J 29/006 |
| | | | | 315/368.18 |
| 4,315,152 A | | 2/1982 | Smith | |

(Continued)

FOREIGN PATENT DOCUMENTS

DE  692 24 506 T2  10/1998

OTHER PUBLICATIONS

German Office Action, with translation thereof, for corresponding DE Application No. 10 2017 205 231.7 dated Oct. 30, 2017.

*Primary Examiner* — Andrew Smyth
(74) *Attorney, Agent, or Firm* — Fish & Richardson P.C.

(57) ABSTRACT

A beam deflector includes a magnetic-flux-guiding structure which has an opening through which a beam axis extends, and at least two coils arranged at the magnetic-flux-guiding structure so that they produce a magnetic field $B_1$ having lines passing through the two coils in succession, leave the magnetic-flux-guiding structure at a first location on a first side in relation to the beam axis, cross the beam axis at a second location which is arranged at a distance along the beam axis from the magnetic-flux-guiding structure, re-enter into the magnetic flux-guiding structure at a third location on a second side lying opposite the first side, and extend around the opening from the third location to the first location within the magnetic-flux-guiding structure.

25 Claims, 10 Drawing Sheets

(56) References Cited

U.S. PATENT DOCUMENTS

| | | | | |
|---|---|---|---|---|
| 4,385,259 | A * | 5/1983 | Chase | H04N 9/28 |
| | | | | 315/368.12 |
| 4,882,486 | A * | 11/1989 | Kruit | H01J 37/05 |
| | | | | 250/305 |
| 5,412,209 | A | 5/1995 | Otaka et al. | |
| 5,629,526 | A * | 5/1997 | Nakasuji | H01J 37/141 |
| | | | | 250/396 ML |
| 6,838,675 | B2 * | 1/2005 | Harada | H01J 37/26 |
| | | | | 250/311 |
| 8,405,045 | B2 | 3/2013 | Preikszas et al. | |
| 10,304,654 | B2 * | 5/2019 | Ikegami | H01J 37/04 |
| 2008/0224063 | A1 * | 9/2008 | Parker | H01J 37/3174 |
| | | | | 250/396 R |
| 2012/0037813 | A1 * | 2/2012 | Lanio | H01J 37/141 |
| | | | | 250/396 ML |
| 2014/0034845 | A1 * | 2/2014 | Parker | H01J 37/3007 |
| | | | | 250/398 |
| 2015/0021476 | A1 * | 1/2015 | Shanel | H01J 37/26 |
| | | | | 250/310 |
| 2015/0125622 | A1 * | 5/2015 | Shepard | H01J 37/3458 |
| | | | | 427/547 |
| 2015/0187538 | A1 * | 7/2015 | Canfield | H01J 35/30 |
| | | | | 378/113 |
| 2016/0268095 | A1 * | 9/2016 | Canfield | H01J 35/06 |
| 2017/0069415 | A1 * | 3/2017 | Faley | G01R 33/389 |
| 2017/0154752 | A1 * | 6/2017 | Essers | H01J 37/28 |
| 2017/0287672 | A1 * | 10/2017 | Gorrilla | H01J 35/14 |

\* cited by examiner

PARTICLE-OPTICAL APPARATUS AND PARTICLE BEAM SYSTEM

CROSS-REFERENCE TO RELATED APPLICATION

The present application is a continuation of, and claims benefit under 35 USC 119(e) to, German application No. 10 2017 205 231.7, filed Mar. 28, 2017. The entire disclosure of this application is incorporated by reference herein.

FIELD

The disclosure relates to a particle-optical apparatus and a particle-optical system having such a particle-optical apparatus.

BACKGROUND

Particle-optical apparatuses use beams of charged particles, such as electron beams and ion beams, for example, for many different purposes, e.g. for obtaining information about objects and for structuring objects. By way of example, electron beam and ion beam microscopes are used to obtain information about examined materials, and electron beam lithography appliances, electron beam welding appliances and ion beam appliances are used to modify the structure of objects.

In a particle beam system, one or more particle beams are produced by a particle source and directed onto an object. To this end, it is desirable to influence the particle beams in a targeted manner using suitable particle-optical apparatuses in order, for example, to direct the particle beams in focus onto a desired location at the object. Such particle-optical apparatuses use magnetic and/or electric fields for influencing the particle beams. The spatial dependence and symmetry of the produced fields is determined by the geometry of the electrodes or coils used to produce the electric and magnetic fields. The spatial dependence and symmetry of the fields determines how the particle-optical apparatus influences the particle beams passing through the fields. By way of example, there are particle-optical apparatuses which provide fields that act as lenses in order to change the convergence of a particle beam passing through the apparatus, there are apparatuses that act as a beam deflector in order to deflect a particle beam passing through the apparatus through a desired angle and there are e.g. apparatuses that act as stigmators in order to astigmatically influence a particle beam passing through the apparatus.

A particle-optical system may be put together from a multiplicity of such apparatuses in order to successively influence the one or more particle beams in different ways, wherein some of the apparatuses also serve to set or adjust the beam within the system in such a way that the beam enters into a subsequent apparatus in a desired way. Here, the design of a particle-optical system is subject to boundary conditions which are predetermined, inter alia, by the installation space assumed by the electrodes and coils, and the holding structures thereof, used to produce the fields. Therefore, in general, it is not possible to realize all desired spatial dependencies and symmetries of fields for influencing the particle beams for a certain desired particle beam system as only a reasonable number of particle-optical apparatuses are available for influencing the particle beams.

SUMMARY

The present disclosure seeks to increase the flexibility when designing particle-optical systems.

Embodiments of the disclosure provide a particle-optical apparatus for influencing the particle beam, the particle-optical apparatus using coils to produce magnetic fields which are oriented transversely to a beam direction of a particle beam passing through the apparatus, to be precise with a significant strength, i.e. a strength that influences the beam, at locations which, as seen in the beam direction, are arranged at a distance from the field-producing coils. By way of example, these fields may be used to deflect the beam that passes through the apparatus and/or modify the beam in respect of its astigmatism. Conventional beam deflectors or stigmators provide the beam-influencing fields with a significant strength at locations which, as seen in the beam direction, substantially overlap with the coils for producing the fields. In contrast thereto, the particle-optical apparatus according to the explained embodiments can be used to produce the significant, particle-beam-influencing magnetic fields at a distance in the direction of the beam passing through the apparatus, which is why the apparatus renders it possible to influence the particle beam in a particle-optical system in regions along the beam which were not reachable by conventional apparatuses. Consequently, particle-optical apparatuses according to embodiments of the present disclosure are able to increase the flexibility when designing particle-optical systems.

According to exemplary embodiments, the particle-optical apparatus includes at least two coils, each with at least one turn, which, in particular, is arranged next to the beam axis and does not enclose the latter, wherein the coils, when the turns thereof carry current and other coils of the particle-optical apparatus do not carry current, produce a significant magnetic deflection field on the beam axis, wherein a maximum distance of the turns from the beam axis is a first distance, wherein a magnetic flux density of the magnetic field has a local maximum of its absolute value along the beam axis, wherein the local maximum is arranged at a location along the beam axis which has a second distance from the turns along the beam axis, and wherein the second axis is at least 0.05 times, in particular at least 0.10 times, in particular at least 0.15 times and in particular at least 0.20 times as large as the first distance.

The extent of the magnetic flux density along the beam axis can be determined experimentally for a given particle-optical apparatus by a measurement of a probe that measures the magnetic flux density and by displacing the latter along the beam axis. If the geometry of the coils and remaining components of the particle-optical apparatus are known, the magnetic field profile can also be determined by numerical simulation. Accordingly, it is possible to determine the location along the beam axis at which the absolute value of the magnetic flux density of the magnetic field produced by the coils has its maximum. Knowledge of the geometry of the coils then renders it possible to determine the distance, projected onto the beam axis, of this location of the maximum from the coils. It is also possible to determine from all the locations which are arranged in the volume of the coils, excluding the feed lines thereof, the location which has the maximum distance from the beam axis. The ratio of these two distances can then assume the aforementioned values. These values state that the magnetic field that is decisive for influencing the particle beam can exert a significant effect at a location that may be arranged along the beam axis at a distance from the coils and that, in particular, may lie outside of the installation space assumed by the coils and other components of the particle-optical apparatus.

According to further exemplary embodiments, the particle-optical apparatus includes at least two coils of a first type on both sides of the beam axis, each having at least one turn, the coils, when both carry current and other coils of the particle-optical apparatus do not carry current, producing a magnetic deflection field at the beam axis which has a centroid at a location $z_0$ on the beam axis, wherein each of the two coils respectively has a centre of mass at a location $\vec{r}_0$, and wherein the following applies:

a ratio between a distance of the location $z_0$ from a connecting line between the two locations $\vec{r}_0$ and a distance of the two locations $\vec{r}_0$ from one another is greater than 0.1, in particular greater than 0.2, in particular greater than 0.5 and in particular greater than 0.8.

Here, the magnetic centroid of the deflection field is the location $z_0$ along the beam axis at which the magnetic field appears to act, i.e. the location at which the particle beam entering into the apparatus would, in the case of the straight-line extension, intersect with the deflected particle beam emerging from the apparatus if the latter were extended in a straight line. This location is also referred to as the tilt point of the beam deflector. A spatially non-extended deflection field acting on the particle beam at the location of the tilt point would have the same effect on the beam at a relatively large distance from the deflection element as the spatially extended significant magnetic deflection field that acts on the beam. By way of example, the magnetic centroid $z_0$ can be calculated according to the following formula:

$$z_0 = \frac{\int_{z_{min}}^{z_{max}} zB_\perp(z)dz}{\int_{z_{min}}^{z_{max}} B_\perp(z)dz}$$

Here, integration is carried out along the beam axis extending in the z– direction. $B_\perp(z)$ is the component of the magnetic deflection field ($B_\perp$) oriented orthogonal to the beam axis; $z_{min}$ and $z_{max}$ are upper and lower limits of integration. As usual, these may be selected to be $-\infty$ and $+\infty$. However, the extent of a particle beam system, in which the apparatus is integrated, is finite. Therefore, in practice, the range of integration between $z_{min}$ and $z_{max}$ may be selected such that, for example, the values of $B_\perp(z)$ there are greater than e.g. 0.01 times the maximum value thereof. The locations $\vec{r}_0$ can be calculated for each coil by way of the following formula:

$$\vec{r}_0 = \underset{\vec{r}_s}{\mathrm{argmax}} \left| \int_0^L \frac{\vec{r}-\vec{r}_s}{|\vec{r}-\vec{r}_s|^3} \times \vec{dl} \right|$$

Here, integration is carried out along the current carrier forming the respective coil, over the length L thereof. $\vec{r}$ are the locations on the centre line of the current carrier of the coil and $\vec{r}_s$ are locations in space. Consequently, this formula for $\vec{r}_0$ selects the location $\vec{r}_s$ at which the absolute value of the integral is at a maximum. The integral corresponds to the integral which is also used in the formula according to Biot-Savart $$\vec{B}(\vec{r}_s) = \frac{\mu_0 \cdot I}{4 \cdot \pi} \int_0^L \frac{\vec{r}-\vec{r}_s}{|\vec{r}-\vec{r}_s|^3} \times \vec{dl}$$

for calculating the magnetic field of an air coil by way of integration along the coil. However, the particle-optical apparatus may have magnetic-flux-guiding structures in the vicinity of the current carrier, and so the conditions for the air coil are not satisfied. The locations $\vec{r}_0$ determined according to the aforementioned formula are close to the locations at which air coils having a geometry equal to the geometry of the current carrier would produce a substantially maximal field. The locations $\vec{r}_0$ serve to determine a location and the coil which can be placed on the beam axis in relation to the location $z_0$.

According to further exemplary embodiments, a particle-optical apparatus for influencing a particle beam includes a magnetic-flux-guiding structure, which has an opening through which a beam axis of a particle beam that passes through the particle-optical apparatus extends. Further, the particle-optical apparatus includes at least two coils, each with at least one turn, the coils being arranged at the magnetic-flux-guiding structure. When carrying current, the coils produce magnetic fields within the magnetic-flux-guiding structure and outside of the magnetic-flux-guiding structure. The magnetic fields can be represented by field lines. These are closed lines which pass through the coils and extend both within the magnetic-flux-guiding structure and outside thereof, for example in the vacuum. The locations at which the magnetic fields act on the particle beam lie outside of the magnetic-flux-guiding structure. The magnetic-flux-guiding structure represents a lower magnetic resistance to the magnetic field than, for example, the vacuum or other bodies arranged outside of the magnetic-flux-guiding structure, through which bodies the magnetic field passes. Therefore, it is possible to set the profile of the magnetic field outside of the magnetic-flux-guiding structure by designing the geometry of the magnetic-flux-guiding structure and the arrangement of the coils on same. In particular, by designing the magnetic-flux-guiding structure and by the arrangement of the coils thereon, it is possible to set the profile of the magnetic field outside of the magnetic-flux-guiding structure in such a way that the particle beam passing through the apparatus along the beam axis is influenced significantly in regions arranged outside of the installation space assumed by the magnetic-flux-guiding structure and the turns of the coils.

According to exemplary embodiments herein, the magnetic-flux-guiding structure and the turns of two coils are designed in such a way that, when these two coils carry current and other coils of the particle-optical apparatus that are possibly present do not carry current, the coils produce a significant magnetic field that influences the beam, the magnetic field having field lines which have the following properties:

The field lines initially pass through a first of the two coils and then a second of the two coils. Between the two coils, the field lines may extend in the magnetic-flux-guiding structure or outside of the magnetic-flux-guiding structure.

The field lines leave the magnetic-flux-guiding structure at first locations which are arranged in a first side in respect of the beam axis; i.e., there are transitions at the first locations, at which the field lines emerge from the magnetic-flux-guiding structure and enter into the vacuum, for example.

The field lines cross the beam axis at second locations which are arranged along the beam axis at a distance from the magnetic-flux-guiding structure. This means that the field lines intersect the beam axis of the second locations. In particular, the field lines can be oriented orthogonal to the beam axis at the second locations; however, other angles are possible.

The field lines re-enter into the magnetic-field-guiding structure at third locations which are respectively arranged on a side lying opposite to the first locations with respect to the beam axis. In particular, the first location, at which a given field line emerges from the magnetic-flux-guiding structure, lies opposite the third location, at which this given field line re-enters into the magnetic-flux-guiding structure, with respect to the beam axis. In particular, it is possible for the field lines to extend exclusively in the vacuum along their path from the first locations to the third locations via the second locations.

From the third locations, at which they enter the magnetic-flux-guiding structure, the field lines extend, at least partly within same, back to the first locations. Here, the field lines may cover the entire path between the third locations and the first locations within the magnetic-flux-guiding structure. However, it is also possible that they re-emerge from the magnetic-flux-guiding structure for the purposes of overcoming a few stretches.

The properties of the field lines specified above apply to at least some of the field lines of the field produced by the two coils. It is not necessary for these properties to apply to all field lines.

According to exemplary embodiments, the first location and the third location are each arranged at a distance from the beam axis that is greater than a smallest distance of the turns of the coils from the beam axis.

According to exemplary embodiments, the distance of the second locations from the magnetic-flux-guiding structure along the beam axis is greater than 0.5 times, in particular greater than 0.7 times, in particular greater than 1.0 times and in particular greater than 1.5 times a distance between the first locations and the associated third locations. By way of example, these distances can be determined by numerical simulation for individual field lines of the magnetic field produced by the two coils. It is not necessary for the aforementioned numerical condition to apply to the distances for all field lines of the magnetic field produced.

According to exemplary embodiments, the magnetic-flux-guiding structure and the two coils attached thereon are designed and configured in such a way that, when one of the two coils carries current and other coils of the particle-optical apparatus do not carry current, this coil produces a magnetic field, for which the following applies: an absolute value of an angle between $\vec{B}_{max}(\vec{r})_0$ and the beam axis is less than or equal to 600, where $\vec{B}_{max}(\vec{r})_0$ represents a flux density of the magnetic field at a location $\vec{r}$ with coordinates x, y and z, at which an absolute value of the flux density of the magnetic field is maximal.

According to exemplary embodiments, coils are arranged next to the beam axis and do not enclose the latter.

The location $\vec{r}$, at which the absolute value of the magnetic field produced by the coil has its maximum, can be determined experimentally for a given apparatus by virtue of, for example, the space in the surroundings of the magnetic-flux-guiding structure and the coils being scanned systematically using a magnetic field sensor, such as a Hall effect probe, for example. Further, this location can be found by numerical simulation. Further, the orientation of the field vector at the location of the maximum can be determined in these ways. From this orientation it is possible, in turn, to calculate the angle included between the field vector, the foot of which is attached to the location of the maximum, and a straight line that passes through the location of the maximum and that is oriented parallel to the beam axis. This angle is less than or equal to 60°, in particular less than or equal to 30° and in particular equal to 0°, meaning that the field vector at the location of the maximum is oriented parallel to the beam axis.

According to exemplary embodiments, the magnetic-flux-guiding structure provides flux paths for the magnetic field, the flux paths extending between the entry of a field line into the magnetic-flux-guiding structure and the emergence thereof from the magnetic-flux-guiding structure, without interruption in the magnetic-flux-guiding structure and around the opening in the magnetic-flux-guiding structure for the passage of the beam. Here, it is possible to distinguish between two groups of profiles of the field lines: a first group of the field lines extends along paths which do not come any closer to the beam axis or the distance of which from the beam axis is, at all points, greater than the smallest distance from the beam axis assumed by the at least one coil. Conversely, a second group of field lines extends along paths which come closer to the beam axis within the magnetic-flux-guiding structure than what corresponds to the smallest distance of the coils from the beam axis.

According to exemplary embodiments, the magnetic-flux-guiding structure is designed in such a way that field lines of both the first group and the second group extend therein. According to alternative exemplary embodiments thereto, the magnetic-flux-guiding structure is designed in such a way that field lines of the second group do not exist therein. In particular, what is possible in this configuration is that field lines emerge from the magnetic-flux-guiding structure in the region of the opening thereof, pass through the opening and re-enter the magnetic-flux-guiding structure on the opposite side instead of circumventing the opening within the magnetic-flux-guiding structure. This will happen, in particular, when the magnetic-flux-guiding structure provides a large magnetic resistance such that field lines emerge from the magnetic structure in the region of the opening for the purposes of overcoming the stretch between the aforementioned third location and first location. In this case, a magnetic field which likewise can influence the particle beam is then also present on the beam axis in the region of the opening.

In particular, the magnetic-flux-guiding structure can be embodied as a flat plate which has a central opening for the passage of the particle beam and which has the coils applied thereon. However, the design of the magnetic-flux-guiding structure is not restricted to the special case of a flat plate. By way of example, the magnetic-flux-guiding structure can be conical or dome-shaped, wherein the beam axis may be an axis of symmetry of the conical or dome-shaped design. However, the magnetic-flux-guiding structure may be embodied even more freely and may have no identifiable symmetry. Accordingly, the coils attached to the magnetic-flux-guiding structure need not have turns which are respectively arranged in a plane. Each turn can extend along an area which has any curved or arched shape. The turns of the coils may be applied to the surface of the magnetic structure and, for example, be held on the latter by adhesive bonding or other fastening device. However, the turns of the coils may also be set into trenches provided in the magnetic-flux-guiding structure. Further, the turns of the coils can be completely embedded in the magnetic-flux-guiding structure.

Further, the magnetic-flux-guiding structure need not be embodied as a body that has closed areas in which the coils are formed. Rather, the body of the magnetic-flux-guiding structure may be perforated, i.e. have openings. In particular, the magnetic-flux-guiding structure can be embodied as a lattice or a scaffold, the webs of which guide the magnetic flux.

According to exemplary embodiments, an edge of the magnetic-flux-guiding structure that defines the opening in the magnetic-flux-guiding structure and that faces the beam axis is arranged with a smaller distance from the beam axis than each location assumed by the coils. In the case of exemplary embodiments herein, at least one slot or one recess is provided in the magnetic-flux-guiding structure which, proceeding from this edge, extends radially to the outside, i.e. away from the beam axis. This slot increases the magnetic resistance for certain paths of magnetic field lines within the magnetic-flux-guiding structure and, in particular, makes it more difficult within the magnetic-flux-guiding structure for the field lines to reach around the opening onto the opposite side with respect to the beam axis. Then, to overcome this path, field lines will more easily emerge from the magnetic-flux-guiding structure in the region of the opening, pass through the opening and re-enter the magnetic-flux-guiding structure on the opposite side.

According to exemplary embodiments, a plurality of such slots are provided in a distributed arrangement in the circumferential direction. According to further exemplary embodiments, the slots in each case extend between two coils that are arranged adjacently to one another in the circumferential direction.

According to exemplary embodiments, two, four, six or eight coils are arranged distributed in the circumferential direction about the beam axis. If two coils are used, these are able, in particular, to produce a dipole field on the beam axis, the strength of the dipole field being adjustable by changing the current flow through the coils. However, the orientation of this dipole field in the circumferential direction about the beam axis is geometrically predetermined by the positions of the two coils in the circumferential direction about the beam axis. If four coils are used, it is possible to set the orientation of the dipole field about the beam axis by setting the currents through the four coils. Then, the particle-optical apparatus can be operated, for example, as a beam deflector which is able to deflect, in an adjustable direction about an adjustable angle, the beam passing therethrough. If four coils are used, it is further possible to produce a quadrupole field on the beam axis, the orientation of the quadrupole field in the circumferential direction, however, not being adjustable. Then, if eight coils are used, it is possible to produce magnetic quadrupole fields on the beam axis which are adjustable in respect of their strength and their orientation about the beam axis. Then, in particular, the particle-optical apparatus can be operated as a stigmator.

According to further exemplary embodiments, pairs of coils with different radial distances from the beam axis are provided. If the assumption is made that a coil that is arranged at the greater distance from the beam axis produces its magnetic field that significantly influences the particle beam at a greater distance from the coil in the beam direction than the coil with the smaller radial distance from the beam axis, it is possible to vary the location along the beam axis of the maximum of the magnetic field produced by the two coils together by way of setting the currents in the coils which are arranged with different radial distances from the beam axis.

The coils described in the embodiments explained above are coils of a first type which, when they are carrying current and other coils of the particle-optical apparatus are not carrying current, produce at least one magnetic field for influencing the particle beam, the maximum on the beam axis of the magnetic field being arranged at a distance from the coils along the beam axis. Depending on the configuration of the magnetic-flux-guiding structure in respect of its magnetic resistance, these coils may also produce a magnetic field within the opening for the beam passage in the magnetic-flux-guiding structure, the magnetic field likewise being able to influence the beam passing through the apparatus. If such a magnetic field is produced within the opening, the particle beam passing through the apparatus is deflected in opposite directions in two regions arranged in succession in the beam direction. Consequently, it is possible to realize a so-called "double deflector".

According to exemplary embodiments, the particle-optical apparatus further includes at least two coils of a second type, each having at least one turn, the coils being arranged at the magnetic-field-guiding structure in such a way that, when both carry current and other coils of the particle-optical apparatus do not carry current, they produce a magnetic field which has field lines that successively penetrate the first and the second coil of the second type, leave the magnetic-flux-guiding structure at a fourth location that is arranged on the second side in relation to the beam axis, cross the beam axis at a fifth location, re-enter the magnetic-flux-guiding structure at a sixth location that is arranged on the first side of the beam axis, and extend around the opening from the sixth location to the fourth location within the magnetic-flux-guiding structure, wherein the fourth location and the sixth location are each arranged at a distance from the beam axis that is less than a smallest distance of the turns of the coils of the second type from the beam axis.

The coils of the second type consequently predominantly produce a magnetic field which, within the opening of the magnetic-flux-guiding structure, unfolds its significant effect for influencing the particle beam passing through the apparatus. Consequently, with the aid of the coils of the second type, it is possible to operate the aforementioned "double deflector" in such a way that the relative strengths of the two deflections of the particle beam are adjustable in two opposite directions. To this end the apparatus includes, according to exemplary embodiments, a power source system which is configured to supply adjustable currents to the coils of the first type and the coils of the second type in each case. According to exemplary embodiments, the power source system includes at least one resistor for dividing the current strengths of the currents supplied to the coils of the first type or of the second type, depending on the magnitude of the resistance. In particular, the resistance can be modifiable in order to change the ratio of these currents. As a result of this, it is easily possible, for example, to provide a "double deflector", which causes a parallel offset of the beam.

According to exemplary embodiments, the magnetic-flux-guiding structure is put together from a plurality of metallic plate elements which, particularly approximately, each have the shape of a circular sector and which each carry one or more coils of the first type on one or both flat sides. Some or all of the plate elements may further carry one or more of the coils of the second type, which are wound around the elements. The plurality of plate elements may be held by a ring structure which, in particular, can have such an embodiment that the ring structure provides a magnetic flux path around the beam axis.

According to embodiments of the disclosure, provision is further made of a particle beam system which has a particle source for producing a particle beam and, further, a particle-optical apparatus according to the embodiment explained above, the particle-optical apparatus being passed through by the particle beam produced. The particle source can be an electron source or an ion source and the particle beam system can be embodied, in particular, as a particle microscope or as a particle beam system for manipulating objects.

BRIEF DESCRIPTION OF THE DRAWINGS

Embodiments of the disclosure are explained in more detail below on the basis of figures, but the disclosure is not restricted to such embodiments. In the figures.

DETAILED DESCRIPTION OF EXEMPLARY EMBODIMENTS

Figure 3:
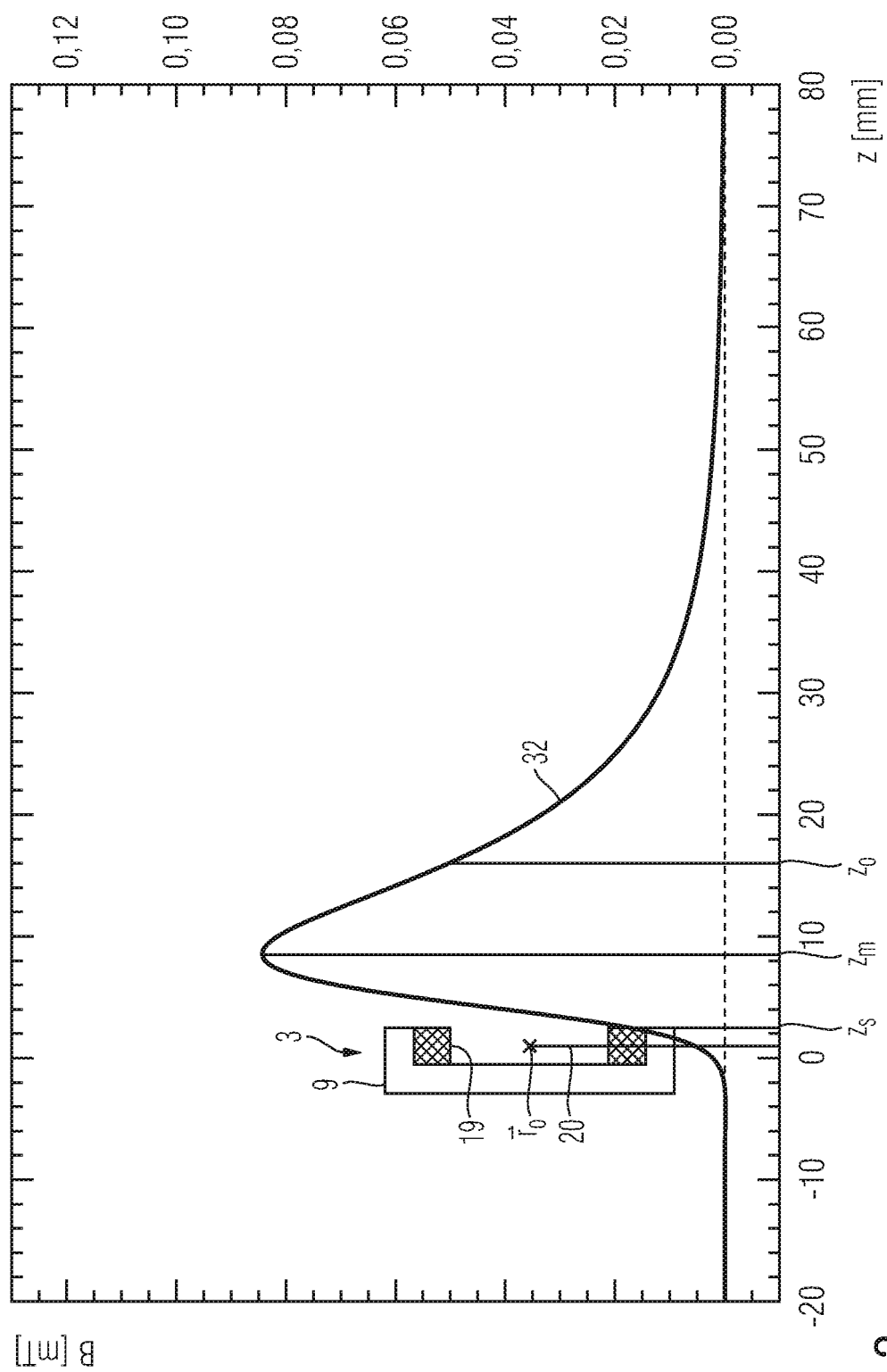
FIG. 3 is a graph which shows a profile of a dipole field produced by the particle-optical apparatus from FIGS. 1 and 2 along a beam axis of the apparatus.

An embodiment of a particle-optical apparatus is explained below on the basis of FIGS. 1 to 3. Here, FIG. 2 shows a plan view of the apparatus, FIG. 1 shows a cross section through the apparatus along the line I-I in FIG. 2 and FIG. 3 shows a curve of a magnetic field produced by the apparatus along a beam axis.

Figures 1, 2:
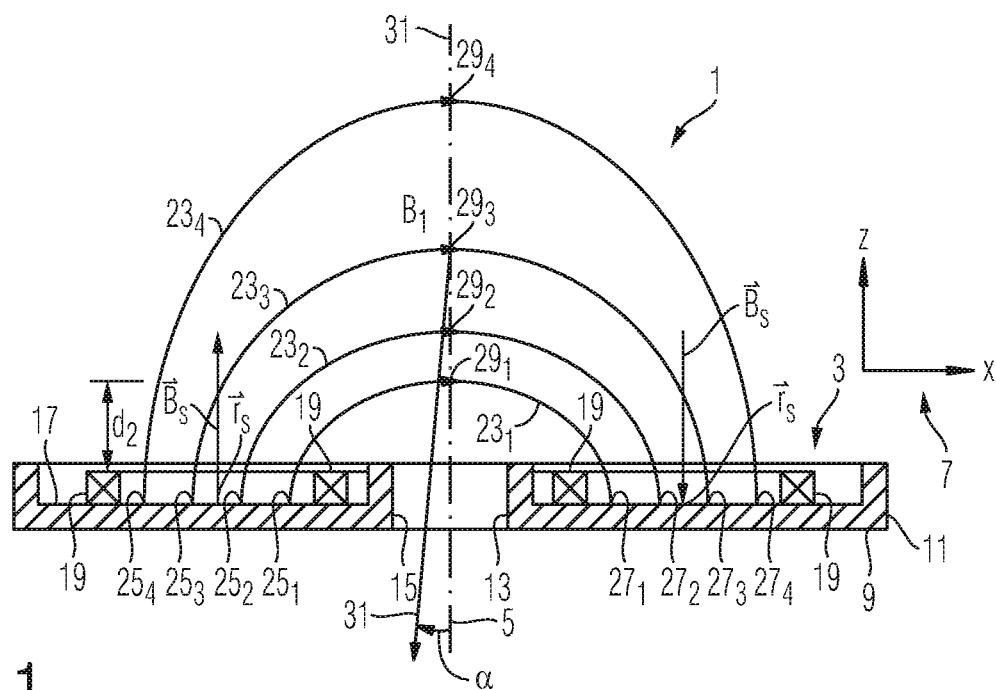
FIG. 1 is a cross-sectional view of a particle-optical apparatus according to an embodiment.
FIG. 2 is a plan view of the particle-optical apparatus from FIG. 1.

The particle-optical apparatus 1 illustrated in FIGS. 1 and 2 includes a magnetic-flux-guiding structure 3 which has a substantially annular-disk-shaped form that is symmetric in relation to a main axis 5. A coordinate system 7 shown in FIGS. 1 and 2 is selected in such a way that the z-axis thereof is oriented parallel to the main axis 5 of the magnetic-flux-guiding structure and an annular-disk-shaped part 9 of the magnetic-flux-guiding structure 3 extends in the xy-plane of the coordinate system. The magnetic-flux-guiding structure in the illustrated embodiment further has a circular outer edge 11 and a central opening 13, which is delimited by an inner edge 15 of the annular-disk-shaped part 9. Four coils 19 are attached to a side 17, at the top in FIG. 1, of the annular-disk-shaped part 9, the coils each having one or more turns of a wire which is connected to a power supply that is not illustrated in the figures and that is configured to supply an adjustable current to each coil. If a current flows through a coil 19, the latter produces a magnetic field, as explained below.

The four coils 19 are distributed around the main axis 5 in the circumferential direction and are arranged in a non-overlapping manner in such a way that each of the coils 19 encompasses a relatively large area of a quadrant on the face of the upper side 17 of the annular-disk-shaped part 9.

The assumption is made that the lower coil 19 and the upper coil 19 shown in FIG. 2 do not carry current and the right coil 19 and the left coil 19 shown in FIG. 2 carry current, with arrows 21 in FIG. 2 indicating the direction of the current flow. This current flow produces a magnetic field $B_1$ outside of the magnetic-flux-carrying structure 3, the magnetic field being illustrated in FIG. 1 by four exemplary field lines $23_1$, $23_2$, $23_3$ and $23_4$. The field lines $23_1$, $23_2$, $23_3$ and $23_4$ emerge from the magnetic-flux-guiding structure 3 at locations $25_1$, $25_2$, $25_3$ and $25_4$ on the upper side 17 of the annular-disk-shaped part 9 and re-enter the magnetic-flux-guiding structure 3 at locations $27_1$, $27_2$, $27_3$ and $27_4$ on the upper side 17. Here, the locations $27_1$ and $25_1$, locations $27_2$ and $25_2$, $27_3$ and $25_3$ and also $27_4$ and $25_4$ lie diametrically opposite one another in respect of the main axis 5. The field lines $23_1$ to $23_4$ cross the main axis 5 at locations $29_1$, $29_2$, $29_3$ and $29_4$, respectively. On the main axis 5, the field lines 23 are oriented in the x-direction and hence orthogonal to the main axis 5. It is clear that the magnetic field $B_1$ has the symmetry of a dipole field on the main axis 5. Hence, this magnetic field $B_1$ is suitable to ensure that a beam of charged particles 31 directed onto the particle-optical apparatus 1 along the main axis 5 from the top in FIG. 1 experiences a deflection such that the particle beam is deflected at an angle α in the y-direction in relation to the main axis 5 when it emerges from the particle-optical apparatus 1 after passing through the opening 13 in the magnetic-flux-guiding structure 3. The deflection in the y-direction is effectuated out of the plane of the drawing of the sectional illustration in FIG. 1. However, the deflection is illustrated as a bend in the line 31 representing the beam of charged particles in FIG. 1 in order to identify this deflection in the drawing.

FIG. 3 shows a graph with a curve 32 which represents the strength of the x-component of the magnetic field $B_1$ in millitesla as a function of the z-position in millimetres along the main axis 5. Here, the opposing coils 19 are excited by an ampere turn. It is clear from the curve 32 that a maximum of the field $B_x(z)$ along the main axis 5 has a maximum at a position $z_m$ of approximately 8 mm. The graph of FIG. 3 further plots the position in the z-direction of one of the coils 19 and of the magnetic-flux-guiding structure 3. A location $z_s$ within the coil 19, which is arranged closest to the maximum at $z_m$ in the case of a projection onto the main axis 5, is denoted by $z_s$ in FIG. 3 and it lies at approximately z=2 mm. It is clear that the maximum of the magnetic field $B_x(z)$ on the main axis 5 is arranged at a distance of approximately 6 mm from the coils that produce the magnetic field. A maximum distance from the main axis 5 assumed by locations arranged within the coils is denoted by $r_{max}$ in FIG. 2 and it is approximately 44 mm. Consequently, a ratio $$\frac{|z_m - z_s|}{r_{max}}$$

is approximately 0.14 and hence greater than 0.02, in particular greater than 0.05, in particular greater than 0.07 and in particular greater than 0.10.

Hence, the particle-optical apparatus 1 can be used to influence a particle beam 31, which extends along the main axis 5 towards the particle-optical apparatus 1, in regions along the main axis 5 which are arranged at a distance from the components 9, 19, which form the particle-optical apparatus, along the main axis 5. This property of the spatial separation along the main axis of the components forming the particle-optical apparatus and of the locations at which the magnetic field produced by these components acts on the particle beam opens up new fields of use for the particle-optical apparatus in particle-optical systems and increases the flexibility in the development of novel particle-optical systems.

This property is also shown in the geometric relation explained below: FIG. 3 plots a location $z_0$ at which the magnetic field that is oriented orthogonally to the beam axis has its centroid. This centroid can be calculated using the following formula:

$$z_0 = \frac{\int_{z_{min}}^{z_{max}} z B_\perp(z) dz}{\int_{z_{min}}^{z_{max}} B_\perp(z) dz}$$

The limits of integration $z_{min}$ and $z_{max}$ should be selected according to circumstances. It is clear from FIG. 3 that no significant contributions to the integrals arise outside of the range between −2 mm and +60 mm, and so this region can be selected to be the area of integration. It is also possible to select other values for $z_{min}$ and $z_{max}$, such as −100 mm and +100 mm, for example.

In the example explained here, $z_0$ equals 16 mm. Further, FIG. 3 shows a location $\vec{r}_0$, at which the geometry of the coil 19 has an action centroid. This location can be calculated according to the following formula that was explained above:

$$\vec{r}_0 = \underset{\vec{r}_s}{\operatorname{argmax}} \left| \int_0^L \frac{\vec{r} - \vec{r}_s}{|\vec{r} - \vec{r}_s|^3} \times \vec{dl} \right|$$

In the example explained, this location $\vec{r}_0$ has a distance of 16 mm from the z-axis. In FIG. 3, reference sign 20 denotes a connecting line between the location $\vec{r}_0$, which is calculated on the basis of the geometry of the coil 19, and a location not illustrated in FIG. 3, which was calculated from the geometry of the coil lying opposite the coil 19 shown in FIG. 3 in relation to the beam axis and which describes the focus of the action thereof. On account of the symmetry of the coil arrangement shown in FIGS. 1 and 2, this line 20 is orthogonal to the z-axis in FIG. 3 and intersects the latter. However, this need not be the case in general. The line 20 has a length of 32 mm and a distance of 15 mm from the location $z_0$. Hence, the ratio of the distance of the location $z_0$ from the connecting line 20 to the length of the connecting line 20 or to the distance of the locations $\vec{r}_0$ of the two coils 19 from one another has a value of 0.47. The magnitude of this value also demonstrates the property of the particle-optical apparatus to the effect of being able to provide an effective deflecting magnetic field outside of the structure that produces the magnetic field.

The field lines of the magnetic field produced by the coils 19 must be closed. In FIG. 2, two lines 35 illustrate how the field line $23_2$, shown in FIG. 1 in an exemplary manner, extends within the magnetic-flux-guiding structure, after the entry thereof into the latter at the location $27_2$, to the location $25_2$, from where it emerges from the magnetic-flux-guiding structure 3. Accordingly, the field line divides after its entry at the location $27_2$ and, within the magnetic-flux-guiding structure, extends around the opening 13 in the magnetic-flux-guiding structure 3 to the location $25_2$.

Further, in FIG. 2, a minimum distance from the main axis 5, which locations within the coils 19 assume, is denoted by $r_{min}$. A distance from the main axis 5 of the location $25_1$, at which the field line $23_1$ shown in an exemplary fashion emerges from the magnetic-flux-guiding structure 3, is denoted by $d_1$ and the distance from the main axis 5 of the location $27_1$, at which this field line $23_1$ enters into the magnetic-flux-guiding structure 3, is denoted by $d_3$. What applies to all field lines shown in an exemplary manner in FIG. 1 is that $d_1$ is greater than $r_{min}$ and that $d_3$ is greater than $r_{min}$. This also corresponds to the fact that the field lines shown in an exemplary manner pass through the two coils that lie opposite one another in respect of the main axis 5 in succession.

In FIG. 1, a distance along the main axis 5 from the magnetic-flux-guiding structure 3 of the location $29_1$, at which the field line $23_1$ shown in an exemplary fashion crosses the main axis 5, is denoted by $d_2$. In the case of the symmetry of the magnetic-flux-guiding structure 3 and of the coils 19 shown in FIGS. 1 and 2, $d_1=d_3$ applies. However, this need not be satisfied in the case of developments of the geometries of the magnetic-flux-guiding structure and of the coils. Further, it is possible to form the ratio $$\frac{d_2}{d_1 + d_3} = x,$$

to be precise for every possible field line of the field $B_1$ which emerges from the magnetic-flux-guiding structure 3 at a first location (25), crosses the main axis 5 at a second location (29) and re-enters the magnetic-flux-guiding structure 3 at a third location (27). For the field line $23_1$ shown in FIG. 1 in an exemplary manner, x=0.385 applies, x=0.415 applies to the field line $23_2$, x=0.505 applies to the field line $23_3$ and x=0.660 applies to the field line $23_4$. From this, it is clear that the magnetic field $B_1$ has field lines for which the ratios $x_1$ and $x_3$ are greater than 0.5, in particular greater than 0.7 and in particular greater than 1.0. However, these conditions need not apply to all field lines of the magnetic field $B_1$. The values of these ratios likewise embody the property of the profile of the magnetic field, shown in FIG. 3, along the main axis 5, according to which the magnetic field influences the particle beam 31 in regions that are arranged at a distance along the main axis 5 from the components 9, 19 that form the particle-optical apparatus 1.

The profile of the magnetic field $B_1$ is achieved by virtue of each of the coils 19, on their own, producing a magnetic field which is illustrated in FIG. 1 by vectors $\vec{B}_s$. It is clear from FIG. 1 that the magnetic field $\vec{B}_s$ produced by each coil 19 has an orientation parallel to the main axis 5. In practice, the magnetic field $\vec{B}_s$ need not be oriented exactly parallel to the main axis 5, and, depending on the configuration of the magnetic-flux-guiding structure, it may be oriented, for example, at an angle of a few degrees in relation to the main axis 5 such that, nevertheless, a predominant component of the magnetic field $\vec{B}_s$ is oriented in the direction of the main axis 5. This fact leads to the magnetic field having field lines which cross the main axis 5 at a comparatively large distance along the axis 5 from the components of the apparatus 1.

The vector $\vec{B}_s$ characterizing the magnetic field of each one of the coils 19 can be determined as follows: initially, a location $\vec{r}_s$ at which the vector $\vec{B}_s$ is attached with its foot or its tip in the region of the respective coil 19 is determined. The location $\vec{r}_s$ can be determined by virtue of calculating the centre of mass of the respective coil over a linear integral along the turns of the coil, according to formula (1) below:

$$\vec{r}_s = \frac{1}{L}\int_0^L \vec{r}\,dl \tag{1}$$

Here, L denotes the length of the wire forming the turns of the coil, which extends along the curve $\vec{r}(l)$ in space, where $0 \leq l < L$.

The magnetic field $\vec{B}(\vec{r})_s$ at the location $\vec{r}_s$ can then be determined by numerical simulation, for example using a finite-element method.

Further embodiments of the particle-optical apparatus are described below on the basis of further figures. In the following description, components that correspond to the components shown in FIGS. 1 to 3 in respect of the properties and/or functions thereof are denoted by the same reference sign. Generally, differences between the various embodiments will be explained and the description of similarities is omitted in order to obtain a desired conciseness of the description. Therefore, reference should be made to the description above and the description below for the purposes of understanding each embodiment.

Figures 4, 5:
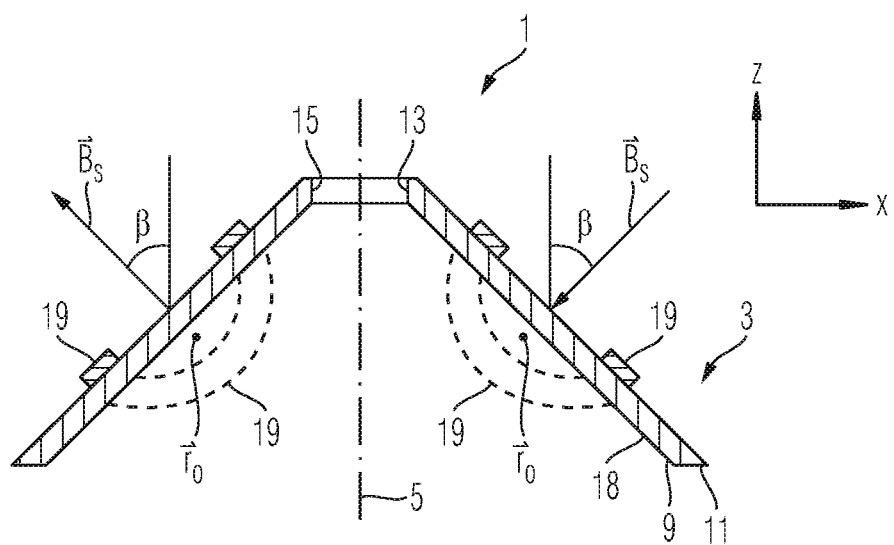
FIG. 4 is a cross-sectional illustration, corresponding to FIG. 1, of a particle-optical apparatus according to a further embodiment.
FIG. 5 is a cross-sectional illustration, corresponding to FIGS. 1 and 4, of a particle-optical apparatus according to an even further embodiment.

FIG. 4 shows a cross section, corresponding to FIG. 1, through a particle-optical apparatus 1 according to a further embodiment. This particle-optical apparatus 1 also includes four coils 19, which are arranged in distributed fashion around a main axis 5 in the circumferential direction, and a magnetic-flux-guiding structure 3, which has a central opening 13. In contrast to the particle-optical apparatus in FIG. 1, a body 9 that forms the magnetic-flux-guiding structure 3 is embodied not with the geometry of a flat disc but with that of a cone. Accordingly, the turns of the coils 19 are not arranged in a planar fashion in the xy-plane but along a curve extending with curvature in space.

Vectors $\vec{B}_s$ which characterize a magnetic field that is produced by each one of the coils 19 are also illustrated in FIG. 4. On account of the conical configuration of the body 9 that forms the magnetic-field-guiding structure 3, the vectors $\vec{B}_s$ are not oriented parallel to the main axis 5, like in FIG. 1, but at an angle β thereto. This angle β is less than 60°, in particular less than 50° and in particular less than 40° and leads to field lines of the produced magnetic field crossing the main axis 5 at a distance along the main axis 5 from the magnetic-flux-guiding structure.

This property of the magnetic field $\vec{B}_s$ respectively produced by the coils can also be obtained in the case of other geometries of the magnetic-flux-guiding structure and of the coils than those shown in FIGS. 1, 2 and 4. In respect of its design, the body 9 that forms the magnetic-flux-guiding structure 3 can be greatly varied, for as long as the condition is met that an angle between the main axis 5, along which a charged particle beam may also extend during the operation for influencing purposes, and the vector $\vec{B}_s$ is less than 60°, less than 50° or less than 40°. In the geometry shown in FIG. 4, the use of equation (1) above for calculating the location $\vec{r}_s$ at which the foot or the tip of the vector $\vec{B}_s$ is attached is inexpedient since, if formula (1) is used, the calculated value $\vec{r}_s$, which corresponds to the centre of mass of the coil 19, would be arranged at the lower side 18 of the cone 9, where no magnetic field is produced in the vacuum.

Here, it is advantageous to determine the location $\vec{r}_s$ by virtue of searching for the maximum of the absolute value of the magnetic field produced by the coil 19 in the surroundings of the particle-optical apparatus 1. This can be carried out experimentally or by way of numerical simulation for a sufficient multiplicity of different locations in the surroundings of the apparatus and selection of the location at which the respectively calculated magnetic field has its largest absolute value. This method for calculating the location $\vec{r}_s$ can also be used in the case of the apparatus explained on the basis of FIGS. 1 to 3 and in the case of the apparatuses explained below. This may yield a slightly different location $\vec{r}_s$ than in the case of the calculation using formula (1), having as a consequence a slightly different vector $\vec{B}_s$ as well; however, what will also apply to the vector is that the angle of the vector in relation to the main axis 5 will be less than 60°, less than 50° or less than 40°.

The locations $\vec{r}_0$, explained above, which were calculated according to the formula explained above, are also plotted in FIG. 4. These locations describe properties of the geometry of the coils 19 and coincide with locations which would emerge in the case of an appropriate application of the Biot-Savart formula for calculating magnetic fields. However, it is clear that substantially no magnetic field is present at the location $\vec{r}_0$ on account of the magnetic-flux-guiding structure since the coil 19 is not an air coil.

Figure 6:
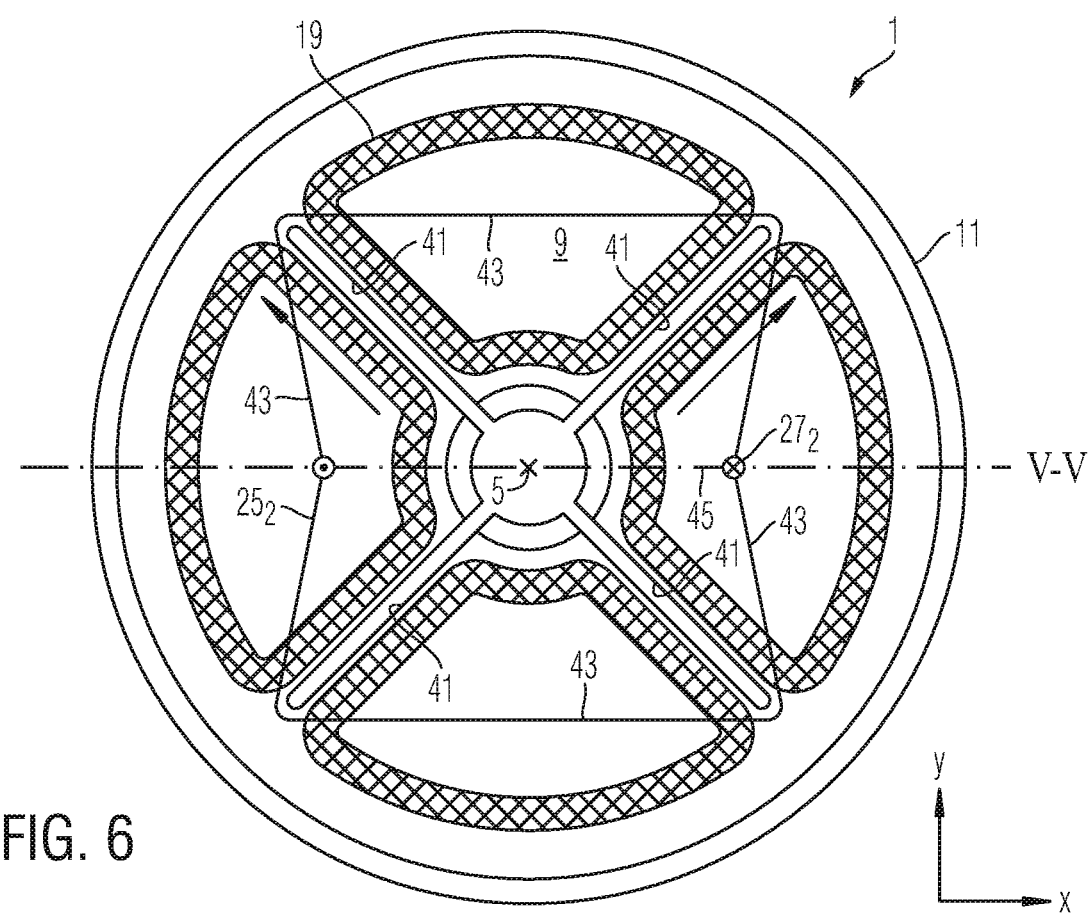
FIG. 6 is a plan view of the particle-optical apparatus from FIG. 5.

A further embodiment of a particle-optical apparatus 1 is shown in FIGS. 5 and 6; to be precise in a plan view in FIG. 6 and in cross section along the line V-V, found in FIG. 6, in FIG. 5. The configuration of the particle-optical apparatus 1 of FIGS. 5 and 6 is largely similar to the configuration of the particle-optical apparatus explained on the basis of FIGS. 1 to 3, but substantially differs from the latter in that slots 41 are provided in the ring plate 9 that forms the magnetic-flux-guiding structure 3, the slots, proceeding from the inner edge 15 of the opening 13 in the magneticflux-guiding structure 3, extending radially to the outside with respect to the main axis 5. These slots 41 modify the magnetic resistance of the magnetic-flux-guiding structure 3 in relation to the magnetic field flux. In particular, the slots 41 prevent the profile of field lines as illustrated in FIG. 2 by the lines 35. This magnetic resistance leads to a part of the field line $23_2$, that is shown in an exemplary fashion in FIG. 5 and enters the magnetic-flux-guiding structure 3 at the location $27_2$, extending along a line, denoted by 43 in FIG. 6, around the opening 13 and the slots 41 in order to arrive at the location $25_2$, at which it emerges from the magnetic-flux-guiding structure 3 again. A second part of field lines extends within the magnetic-flux-guiding structure 3 from the location $27_2$ to the main axis 5, emerges at the edge 15 of the opening 13 from the magnetic-flux-guiding structure 3, crosses the main axis in the vacuum and thereafter re-enters into the magnetic-flux-guiding structure by the edge 15 in order to arrive at the location $25_2$.

Consequently, two types of flux paths arise within the magnetic-flux-guiding structure, wherein the one type, illustrated in an exemplary manner by the lines 43 in FIG. 6, extends around the opening 13 and the other type, illustrated in an exemplary manner by the line 45 in FIG. 6, passes through the opening 13 and consequently leads to a magnetic field $B_2$ on the main axis 5, which likewise influences the particle beam 31 passing through the particle-optical apparatus 1. In FIG. 5, this magnetic field $B_2$ is illustrated by three exemplary field lines 47. As a result of this magnetic field $B_2$, the particle beam 31, after having being deflected in a direction by the magnetic field $B_1$ that is formed at a distance along the axis 5 from the apparatus 1, is deflected in a direction opposite thereto when passing through the opening 13 in the magnetic-flux-guiding structure 3. The absolute values of the deflection angles produced by the field $B_1$ and the field $B_2$ need not be equal. FIG. 5 illustrates a situation in which the absolute values of these deflection angles are the same, however, and so the particle beam 31 extends parallel to the main axis 5 again after passing through the particle-optical apparatus 1, the particle beam also having approached the particle-optical apparatus 1 along the main axis. However, after passing through the particle-optical apparatus 1, the particle beam 31 is offset by an absolute value m in the y-direction in relation to a straight line along which it approached the particle-optical apparatus 1. The deflection in the y-direction is effectuated out of the plane of the drawing of the sectional illustration in FIG. 5. However, like in FIG. 1, the deflections are illustrated in FIG. 5 as bends in the line 31 representing the beam of charged particles in order to identify these deflections in the drawing.

Figure 7:
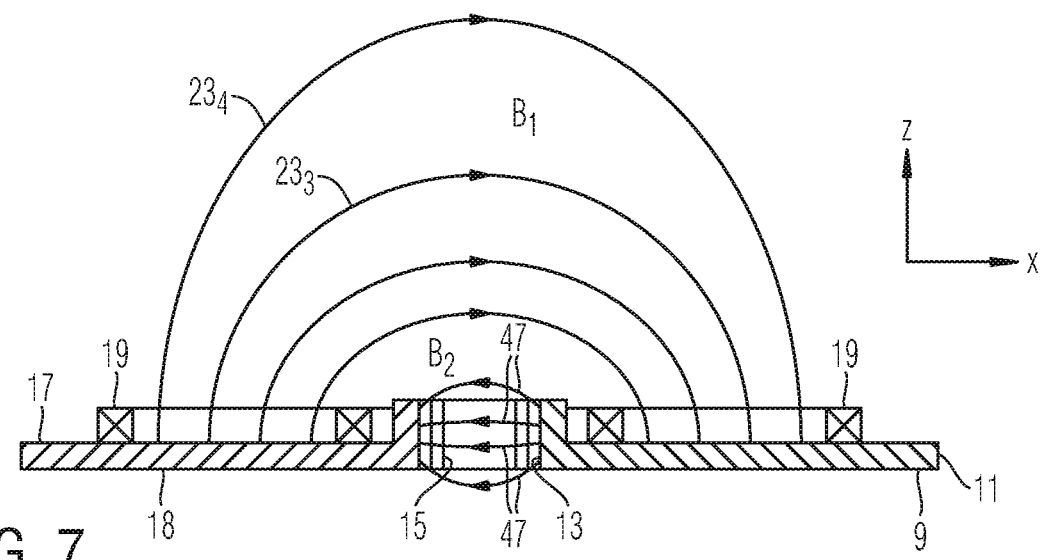
FIG. 7 is a cross-sectional illustration, corresponding to FIGS. 1, 4 and 5, of a particle-optical apparatus according to an even further embodiment.
Figure 8:
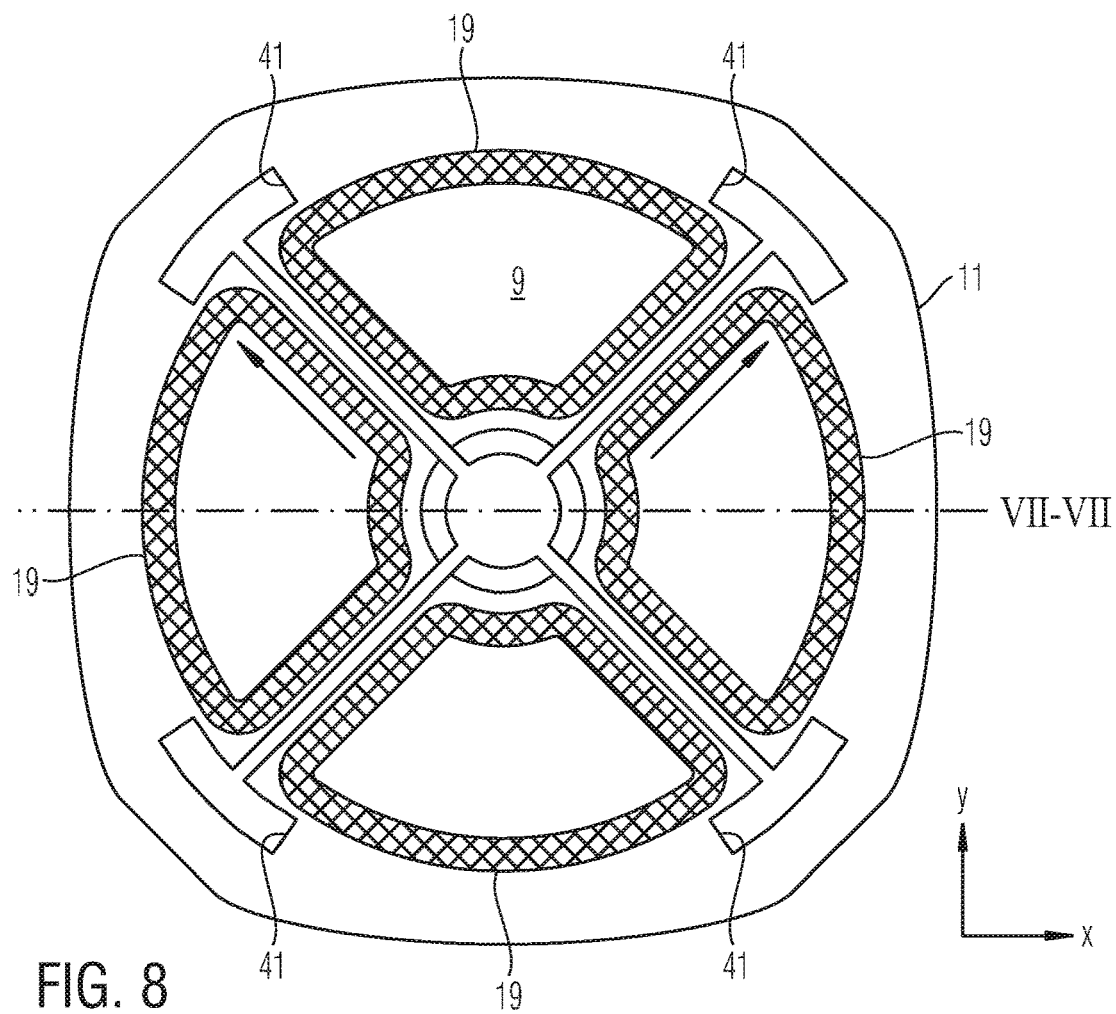
FIG. 8 is a plan view of the particle-optical apparatus from FIG. 7.

A further embodiment of a particle-optical apparatus is now explained on the basis of FIGS. 7 and 8, wherein FIG. 8 shows a plan view of the particle-optical apparatus 1 and FIG. 7 shows a cross section along the line VII-VII in FIG. 8. The particle-optical apparatus 1 illustrated in FIGS. 7 and 8 substantially differs from the particle-optical apparatus illustrated in FIGS. 5 and 6 in terms of the configuration of the slots 41, which are provided in a ring plate 9 that forms the magnetic-flux-guiding structure 3. In comparison with FIG. 6, the slots 41 in FIG. 8 extend further in the radially outward direction in respect of a main axis 5 of the apparatus and also in part extend in the circumferential direction there. This leads to the magnetic flux path illustrated by the lines 43 in FIG. 6, which extends around the opening 13, experiencing an even higher magnetic resistance. In comparison with the embodiment of FIGS. 5 and 6, this leads to an even greater proportion of field lines extending along the flux path illustrated by the line 45 in FIG. 6 and emerging from the magnetic-flux-guiding structure 3 at the edge 15 of the opening 13, crossing the main axis 5 and then re-entering the magnetic-flux-guiding structure 3. This, in turn, leads to the strength of the magnetic field $B_2$ increasing relative to the strength of the magnetic field $B_1$ in comparison with the embodiment shown in FIGS. 5 and 6. In FIG. 7, this is represented by virtue of four exemplary field lines 47 being illustrated for the magnetic field $B_2$, in contrast to the three exemplary field lines 47 for the magnetic field $B_2$ shown in FIG. 5.

From a comparison between the embodiments illustrated on the basis of FIGS. 5 and 6 on the one hand and the embodiments illustrated on the basis of FIGS. 7 and 8 on the other hand, it is clear that the ratio of the effects exerted by the magnetic fields $B_1$ and $B_2$ on the particle beam passing through the apparatus can be adjusted by the geometric design of the slots 41 in the magnetic-flux-guiding structure. This leads to the particle beam passing through the particle-optical apparatus experiencing two deflections in mutually opposite directions in succession, wherein the ratio of the absolute values of the respective deflection angles can be set by the geometry of the slots 41 in the magnetic-flux-guiding structure 9. By setting the current flowing through the turns of the coils 19, it is possible to modify the magnitude of the respective deflection angle, with the ratio of the absolute values of the deflection angles, however, being maintained.

Figure 9:
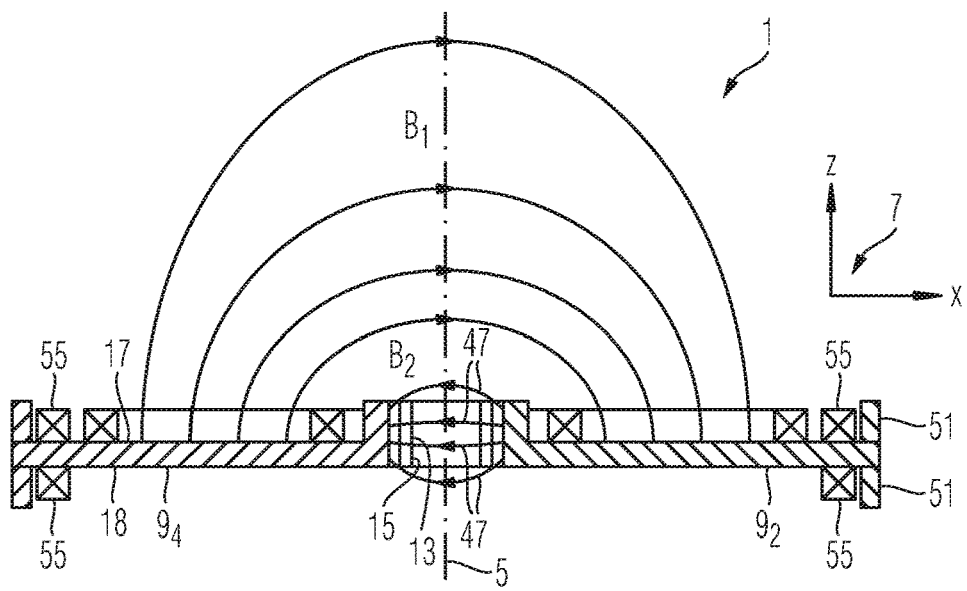
FIG. 9 is a cross-sectional illustration, corresponding to FIGS. 1, 4, 5 and 7, of a particle-optical apparatus according to an even further embodiment.
Figure 10:
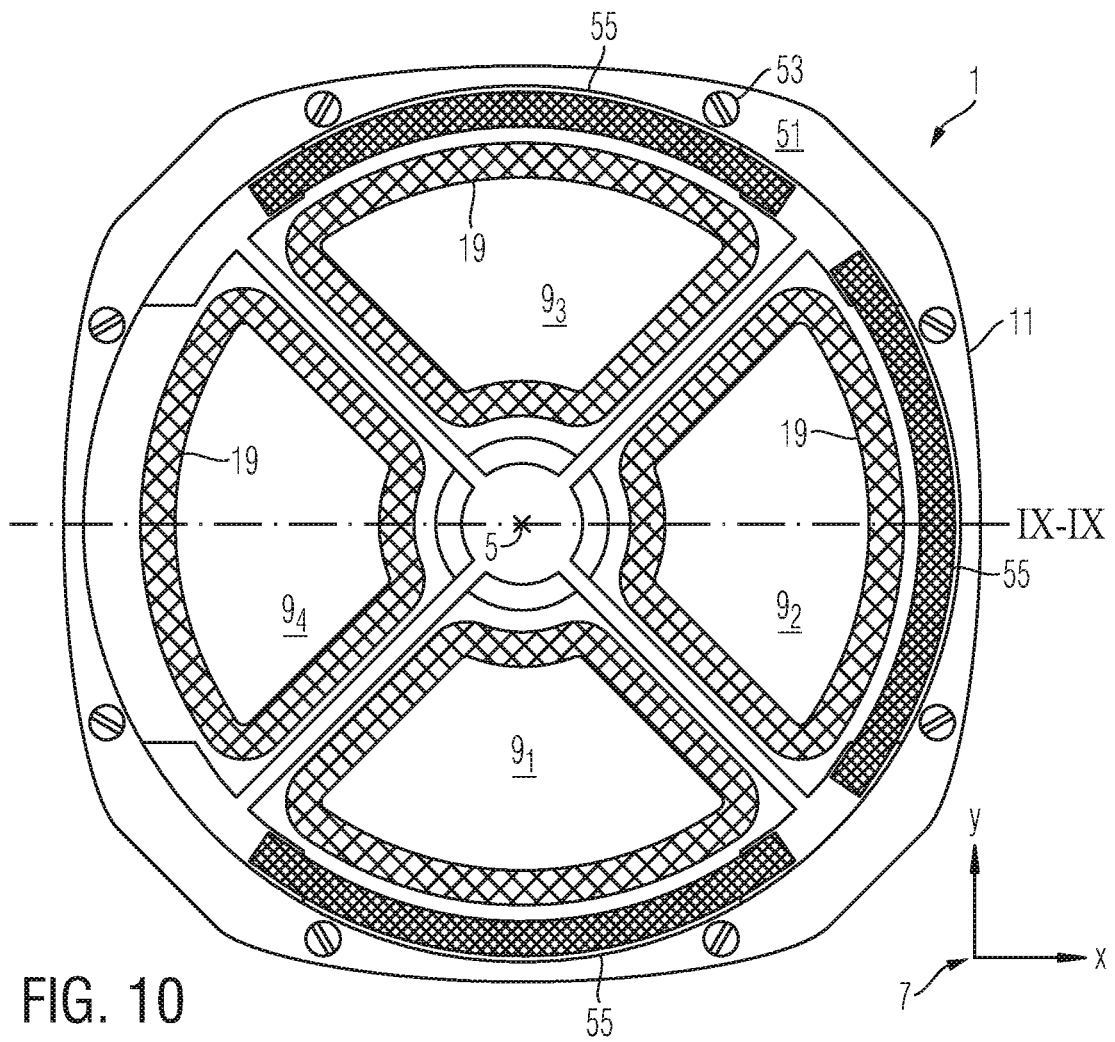
FIG. 10 is a plan view of the particle-optical apparatus from FIG. 9.

Now FIGS. 9 and 10 are used to explain an embodiment in which it is also possible to set the ratio of the absolute values of the deflection angles of the two successive deflections experienced by the particle beam by way of the magnetic fields $B_1$ and $B_2$. Here, once again, FIG. 10 is a plan view of the particle-optical apparatus and FIG. 9 is a cross-sectional view along the line IX-IX in FIG. 10.

The particle-optical apparatus 1 of FIGS. 9 and 10 once again has four coils 19 of the type as explained in the preceding embodiments. The magnetic-flux-guiding structure once again has a substantially annular-disc-shaped structure. However, it is made up of individual elements in this case, namely four sector-shaped plates $9_1$, $9_2$, $9_3$ and $9_4$ and outer rings 51, to which the sectors $9_1$ to $9_4$ are connected by screws 53. The sectors $9_1$ to $9_4$ are held by the outer rings 51 in such a way that they are not in contact and that, as a result thereof, slots 41 once again exist in the magnetic-flux-guiding structure 3 between the sectors, the slots increasing the resistance of magnetic flux paths around the opening 13. However, the outer rings 51 provide magnetic flux paths which extend around the opening 13. The magnetic resistance of these flux paths can be increased further by virtue of manufacturing the outer rings 51 from a material which has a relatively low magnetizability. In particular, the magnetizability of the material from which the outer rings 51 are manufactured may be less in this case than the magnetizability of the material from which the sector-shaped plates $9_1$, $9_2$, $9_3$ and $9_4$ are manufactured.

Each of the sector-shaped plates $9_1$ to $9_4$ carries one of the coils 19 of this first type, as is also the case in the embodiments explained above. Moreover, each of the sector-shaped plates $9_1$ to $9_4$ carries a coil 55 of a second type. The coils 55 may, in turn, have one or more turns and are arranged on the outer edge of the plates $9_1$ to $9_4$ in relation to the main axis 5 and are wound around the respective plate such that the turns of the coils 55 extend not only along the upper side 17 of each plate 9 but also along the lower side 18 thereof.

Consequently, a current flow through the right-hand coil 55 in FIG. 10 and through the left-hand coil 55 in FIG. 10 produces field lines which extend toward the main axis 5, for example in the plate $9_2$, emerge at the edge 15 of the opening 13 in the magnetic-flux-guiding structure 3 from the latter, cross the main axis 5 and re-enter the magnetic-flux-guiding structure 3 again at the opposite side, and consequently contribute to the magnetic field $B_2$, illustrated by the field lines 47 in FIG. 9, for deflecting the particle beam when passing through the opening 13.

Then, these field lines extend further in the plate $9_4$ in the radially outward direction, pass through the coil 55 arranged to the left in FIG. 10 and then extend back through the outer ring 51 to the coil 55 that is arranged at the right and illustrated in FIG. 10. The coil 55 arranged the left in FIG. 10 is not illustrated in FIG. 10 in order to make the configuration of the part of the plate $9_4$ that carries the coil 55 visible.

Consequently, it is possible to set the ratio of the absolute values of the deflection angles of the deflections experienced in succession by the particle beam 31 when passing through the magnetic fields $B_1$ and $B_2$ by way of the ratio with which the coils of the first type 19 and the coils of the second type 55 are excited with the currents supplied thereto. A power supply system 57 suitable to this end is illustrated schematically in FIG. 11. This power supply system 57 supplies two coils 19 of the first type, lying opposite one another in respect of the main axis 5, and two coils 55 of the second type, likewise lying opposite one another in respect of the main axis 5. These four coils 19, 55 are supplied by a single power source 59, the current provided thereby being adjustable. A divider resistor 63 is connected to the power source 59 parallel to the coils 19, 55. A resistor 61 connects the point between the coils 19 and 55 and a division point of the divider resistor 63. By changing the resistance 63, it is possible to modify the ratio of the currents supplied to the coils 19 of the first type and to the coils 55 of the second type. This leads to a change in the ratios of the absolute values of the deflection angles of the two deflections by way of the magnetic fields $B_1$ and $B_2$. By changing the current provided by the power source 59, it is possible to modify the deflection angles while maintaining the ratio thereof that is predetermined by the resistance 63.

However, it is also possible to supply the coils 19 and 55 from separate power sources. This leads to greater flexibility since the sign of the ratio of the currents supplied to the coil pair 19 and the coil pair 55 is also adjustable. Then, it is also possible for the deflection by the coil pair 19 to be effectuated in different direction in the xy-plane than the deflection by the coil pair 55. In such a case, the beam emerging from the particle-optical apparatus is skew in relation to the beam entering the particle-optical apparatus.

In the embodiments explained above, the particle-optical apparatus 1 in each case has four coils 19 of the first type, with the coils 19 respectively illustrated to the left and right in FIGS. 2, 6, 8 and 10 having current flowing therethrough in such a way that a dipole field that is oriented in the x-direction arises on the main axis 5. The orientation of this dipole field in the circumferential direction around the main axis can be modified by virtue of current also being supplied to the coils 19 illustrated top and bottom in FIGS. 2, 6, 8 and 10. If current were only supplied to the coils 19 illustrated top and bottom in these figures, the coils would produce a dipole field oriented in the y-direction on the main axis 5. By setting the ratio of the currents supplied to the coils illustrated on the left and on the right on the one hand and to the coils illustrated at the top and at the bottom on the other hand, it is possible to set the orientation of the dipole field produced on the main axis in the circumferential direction about the main axis as desired.

Figure 12:
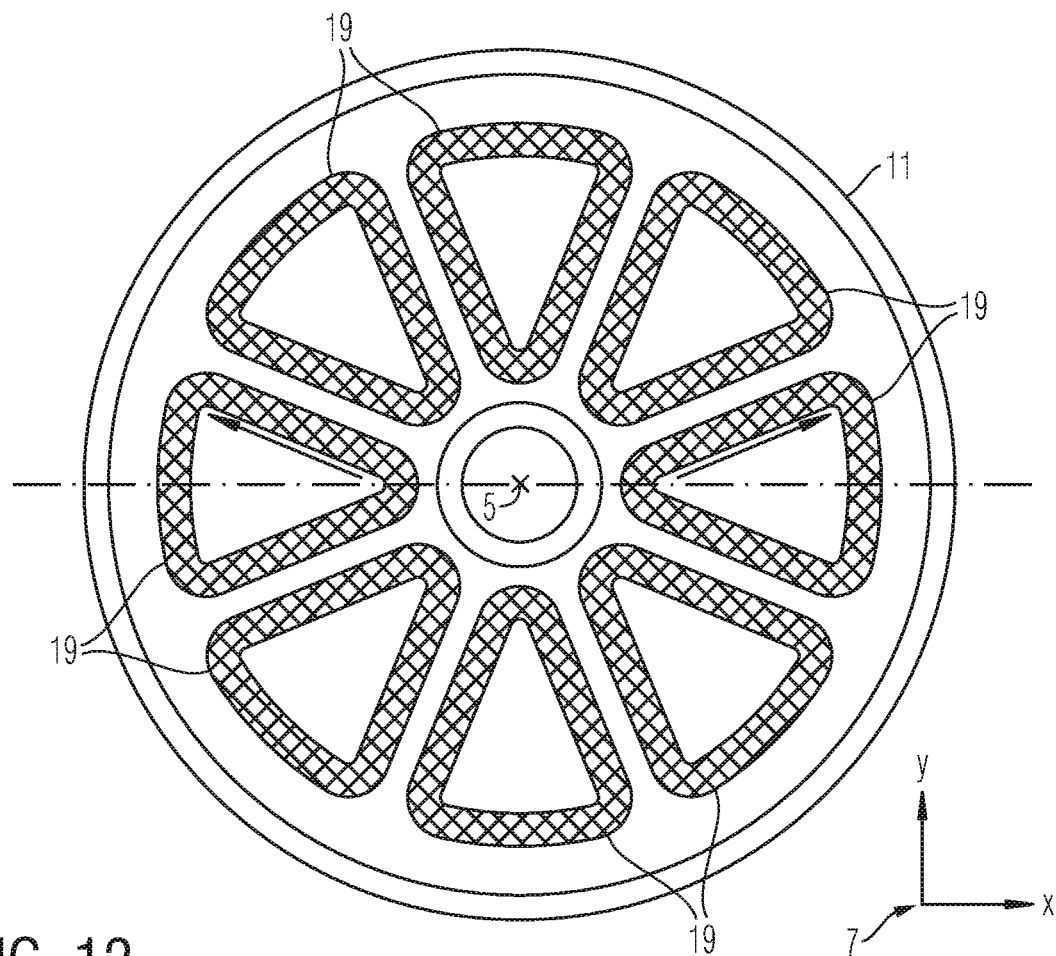
FIG. 12 is a plan view, corresponding to FIGS. 2, 6, 8 and 10, of a particle-optical apparatus according to a further embodiment.

FIG. 12 shows a further embodiment of a particle-optical apparatus 1 in an illustration in a plan view, which corresponds to the illustrations in FIGS. 2, 6, 8 and 10. In contrast to the embodiments explained above, the embodiment of the particle-optical apparatus illustrated in FIG. 12 does not include four but eight coils 19 of the first type, which are arranged distributed around the main axis 5 of the particle-optical apparatus in the circumferential direction. By supplying suitable currents to these eight coils 19, it is possible to produce a magnetic field $B_1$ which can act on a particle beam along the beam axis 5 at a distance from the particle-optical apparatus 1 and which has the symmetry of a dipole field or of a quadrupole field or of a quadrupole field that has a dipole field superposed thereon, which is adjustable in view of its strength and orientation about the main axis 5. By way of example, using such a quadrupole field, it is possible to modify the astigmatism of the particle beam passing through the particle-optical apparatus 1.

Figure 13:
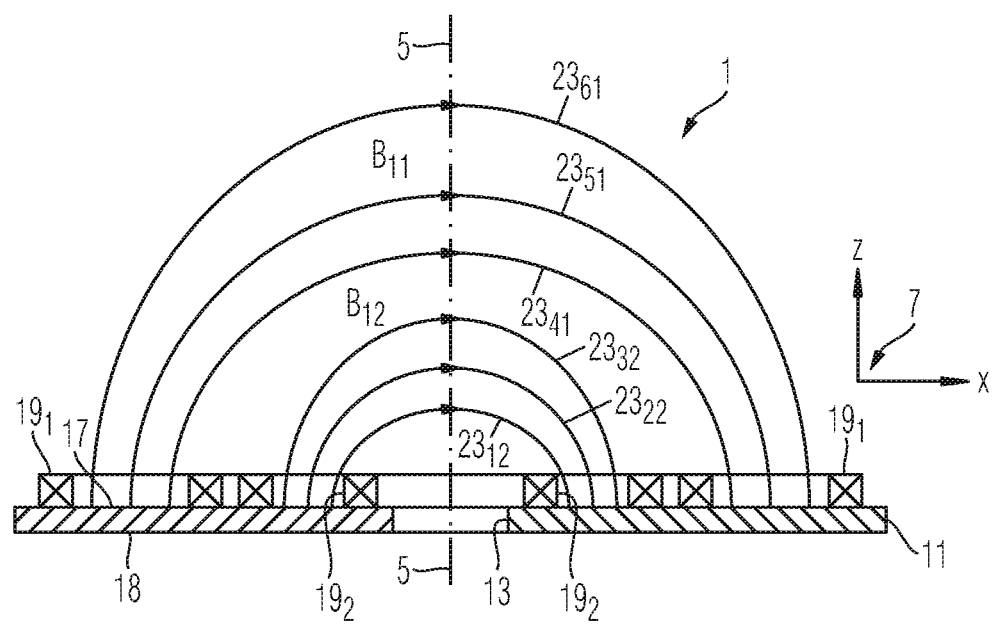
FIG. 13 is a cross-sectional illustration, corresponding to FIGS. 1, 4, 5, 7 and 9, of a particle-optical apparatus according to an even further embodiment.
Figure 14:
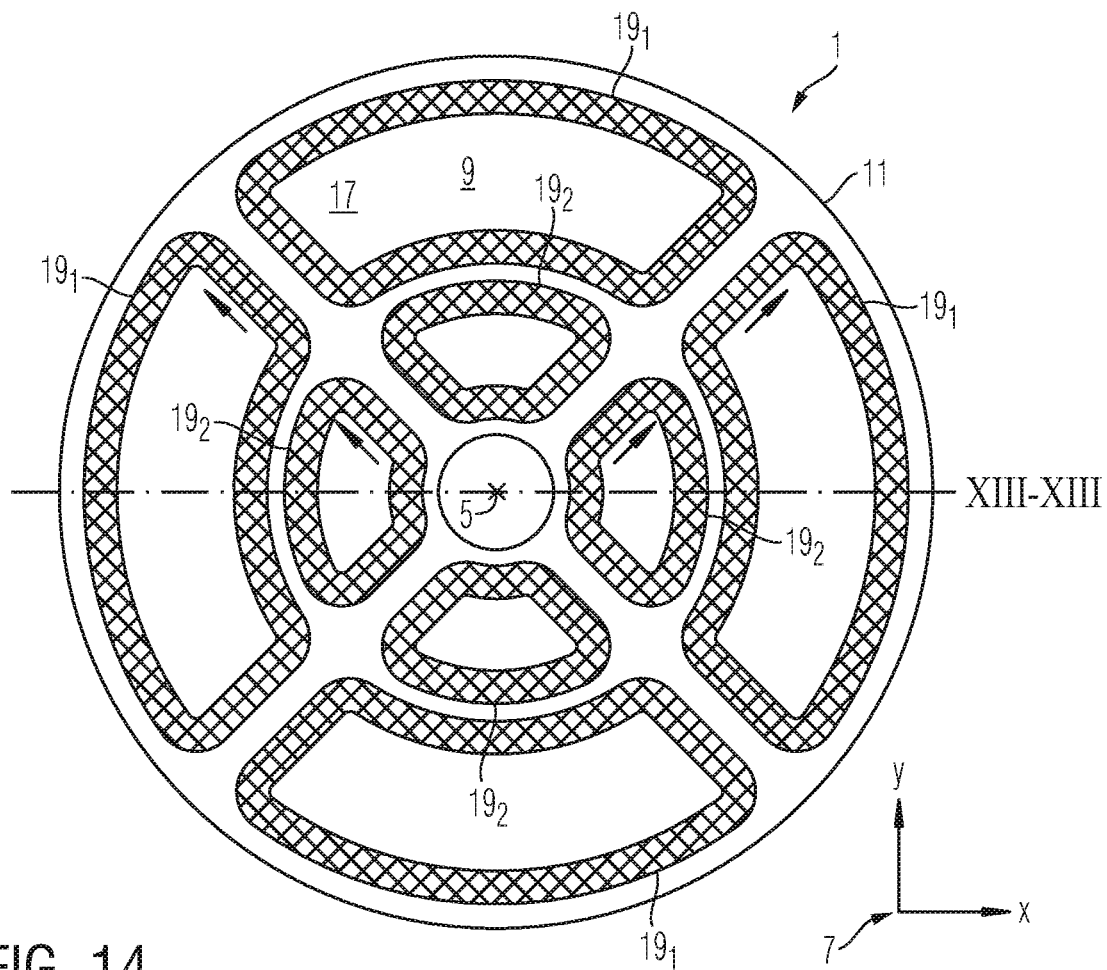
FIG. 14 is a plan view of the particle-optical apparatus from FIG. 13.
Figure 15:
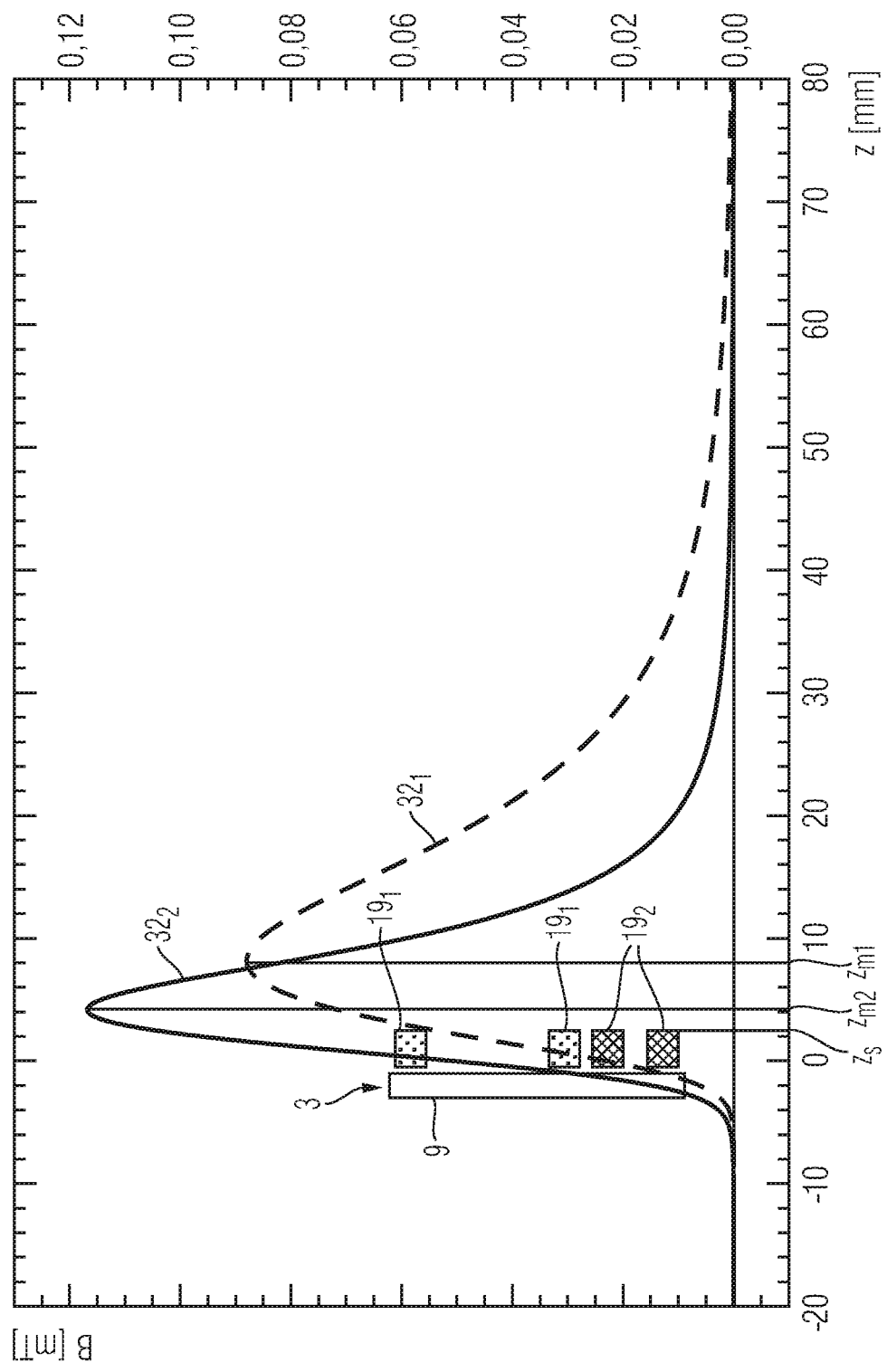
FIG. 15 is a graph which shows a profile of a dipole field produced by the particle-optical apparatus from FIGS. 13 and 14 along a beam axis of the apparatus.

FIG. 3 was used to explain that the maximum of the magnetic field $B_1$, produced by the coils 19 of the first type, is arranged along the main axis 5 at a distance from the components 19, 9 of the particle-optical apparatus. FIGS. 13, 14 and 15 are now used to explain an embodiment of a particle-optical apparatus 1, in which this distance is adjustable. Here, FIG. 14 shows an illustration corresponding to FIGS. 2, 6, 8 and 10, which shows a plan view of the particle-optical apparatus 1, FIG. 13 shows the particle-optical apparatus in a section along the line XIII-XIII in FIG. 14 and FIG. 15 shows an illustration corresponding to FIG. 3, which shows profiles of magnetic fields, produced by this apparatus, along the main axis 5. In contrast to the embodiments explained above, the particle-optical apparatus 1 explained on the basis of FIGS. 14 and 15 has two different sorts of coils 19 of the first type, namely a first sort of coils $19_1$ and a second sort of coils $19_2$. Here, the coils $19_1$ of the first sort are arranged at a greater distance from the main axis 5 than the coils $19_2$ of the second sort. The coils $19_2$ of the second sort produce a magnetic field $B_{12}$ which is illustrated by exemplary field lines $23_{12}$, $23_{22}$ and $23_{32}$ in FIG. 13. The coils 191 of the first sort produce a magnetic field $B_{11}$ which is illustrated in FIG. 13 by exemplary field lines $23_{41}$, $23_{51}$ and $23_{61}$. It is clear that the magnetic field produced by the coils $19_1$ of the first sort acts with a greater distance along the main axis 5 from the particle-optical apparatus 1 than the magnetic field $B_{12}$ produced by the coils $19_2$ of the second sort. This also emerges from the graph of FIG. 15, which illustrates the profile of the magnitude of the magnetic field produced by the coils $19_1$ of the first sort upon excitation with an Ampere turn along the main axis 5 using a curve $23_1$ and the absolute value of the magnetic field $B_{12}$ produced by the coils $19_2$ of the second sort upon excitation with an Ampere turn along the main axis as a curve $32_2$. The maximum of the curve $32_1$ lies at a position $z_{m1}$ of approximately 8 mm and the maximum of the curve $32_2$ lies at a position $z_{m2}$ of approximately 4 mm. Hence, the distance $z_{m1}-z_s$ of the maximum of the magnetic field produced by the coils $19_1$ of the first sort from the components of the particle-optical apparatus is approximately 6 mm and the corresponding distance $z_{m2}-z_s$ of the magnetic field produced by the coils $19_2$ of the second sort is approximately 2 mm. By setting the ratio of the current flow through the coils $19_1$ of the first sort and the coils $19_2$ of the second sort, it is consequently possible to modify the location of the maximum of the field, produced together by the coils $19_1$ and $19_2$, between $z_{m2}$ and $z_{m1}$ in a continuous manner.

The coils $19_1$ of the first sort and the coils $19_2$ of the second sort can be excited by separate power sources in turn.

Figure 11:
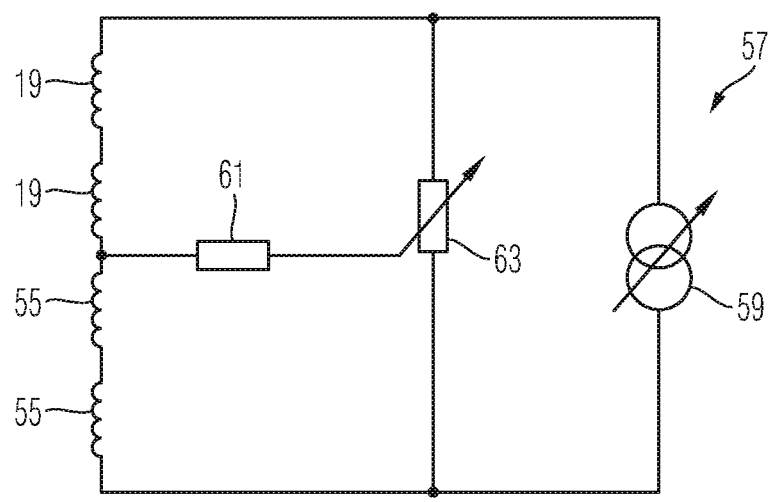
FIG. 11 is a schematic illustration of a power supply system for coils of a particle-optical apparatus according to one embodiment.

However, it is also possible to respectively excite two coils $19_1$ of the first sort, lying opposite one another in respect of the main axis 5, and the coils $19_2$ of the second sort radially adjacent thereto by way of a single current source, as explained on the basis of FIG. 11. Then, two such power sources would be involved for the four coils $19_1$ of the first sort and the four coils $19_2$ of the second sort, as shown in FIG. 14. The location of the maximum of the fields produced together by the coils $19_1$ and $19_2$ can then be set by modifying the setting of the resistors 63 of the two circuits 57 according to FIG. 11.

Figure 16:
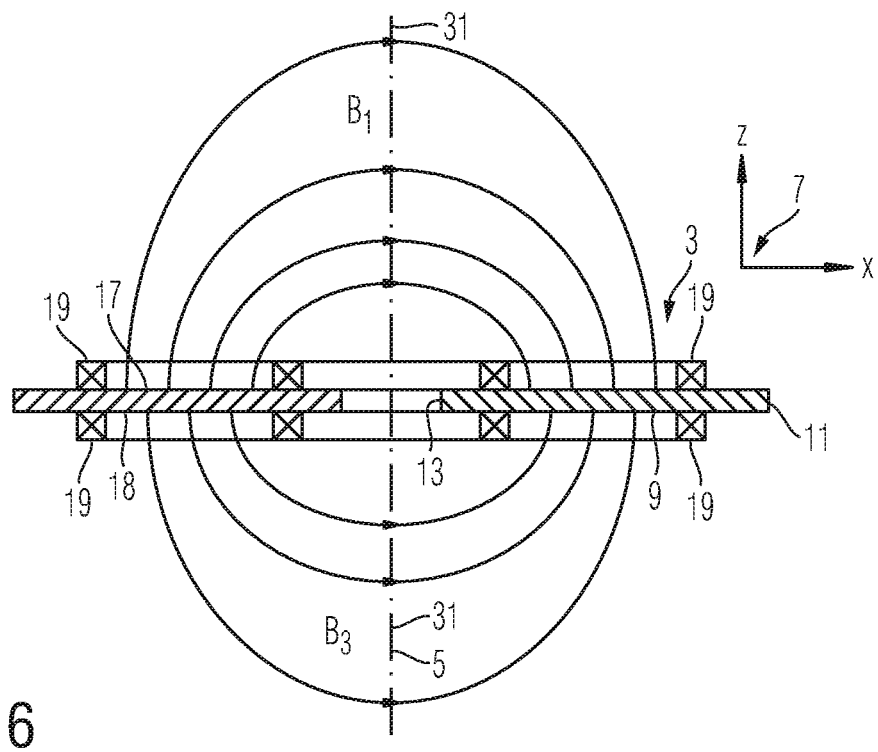
FIG. 16 is a cross-sectional illustration, corresponding to FIGS. 1, 4, 5, 7, 9 and 13, of a particle-optical apparatus according to an even further embodiment.

In the embodiments explained above, the coils 19 of the first type are respectively arranged on a single side of the magnetic-flux-guiding structure, namely on the upper side 17 of the magnetic-flux-guiding structure 3 in the illustrations of FIGS. 1, 5, 7, 9 and 13. FIG. 16 shows a section through an embodiment of a particle-optical apparatus 1, in which coils 19 of the first type are arranged both on the upper side 17 and on the lower side 18 of the magnetic-flux-guiding structure 3. The coils 19 arranged on the upper side 17 of the magnetic-flux-guiding structure 3 produce a magnetic field $B_2$ which acts on the particle beam 31 above the magnetic-flux-guiding structure 3 in FIG. 16, as was also the case in the embodiments illustrated above. The coils 19 of the first type arranged on the lower side 18 of the magnetic-flux-guiding structure 3 produce a magnetic field $B_3$ which acts on the particle beam 31 below the magnetic-flux-guiding structure in the illustration of FIG. 16. By way of an appropriate supply of currents to the coils 19, which are arranged on the upper side 17 and the lower side 18 of the magnetic-flux-guiding structure 3, it is possible to set the two magnetic fields $B_1$ and $B_3$ as desired in respect of the magnitude and orientation thereof. In particular, it is therefore possible, inter alia, to provide a so-called "double deflector" for the particle beam passing through the particle-optical apparatus 1.

The embodiment illustrated in FIG. 16 can be developed further, for example by virtue of introducing slots 41 into the magnetic-flux-guiding structure 3. These slots 41, in turn, lead to the magnetic field $B_2$ shown in FIGS. 5 and 7 arising in the region of the opening 13 in the magnetic-flux-guiding structure 3 such that, overall, it is possible to produce three magnetic fields $B_1$, $B_2$ and $B_3$ for deflecting the particle beam. If, furthermore, coils 55 of the second type are additionally provided, each of the fields $B_1$, $B_2$ and $B_3$ can be modified individually by mixing the coil currents in order to produce a "triple deflector", in which three deflection angles are freely adjustable. By way of example, such a "triple deflector" can be used to selectively direct a particle beam onto two or more apertures or openings with different geometries in a plate, which is a arranged along the main axis 5 in the region of the opening 13, and to subsequently steer the particle beam back onto the main axis 5 again. Consequently, the openings with different geometries can act on the beam as different stops.

Figure 17:
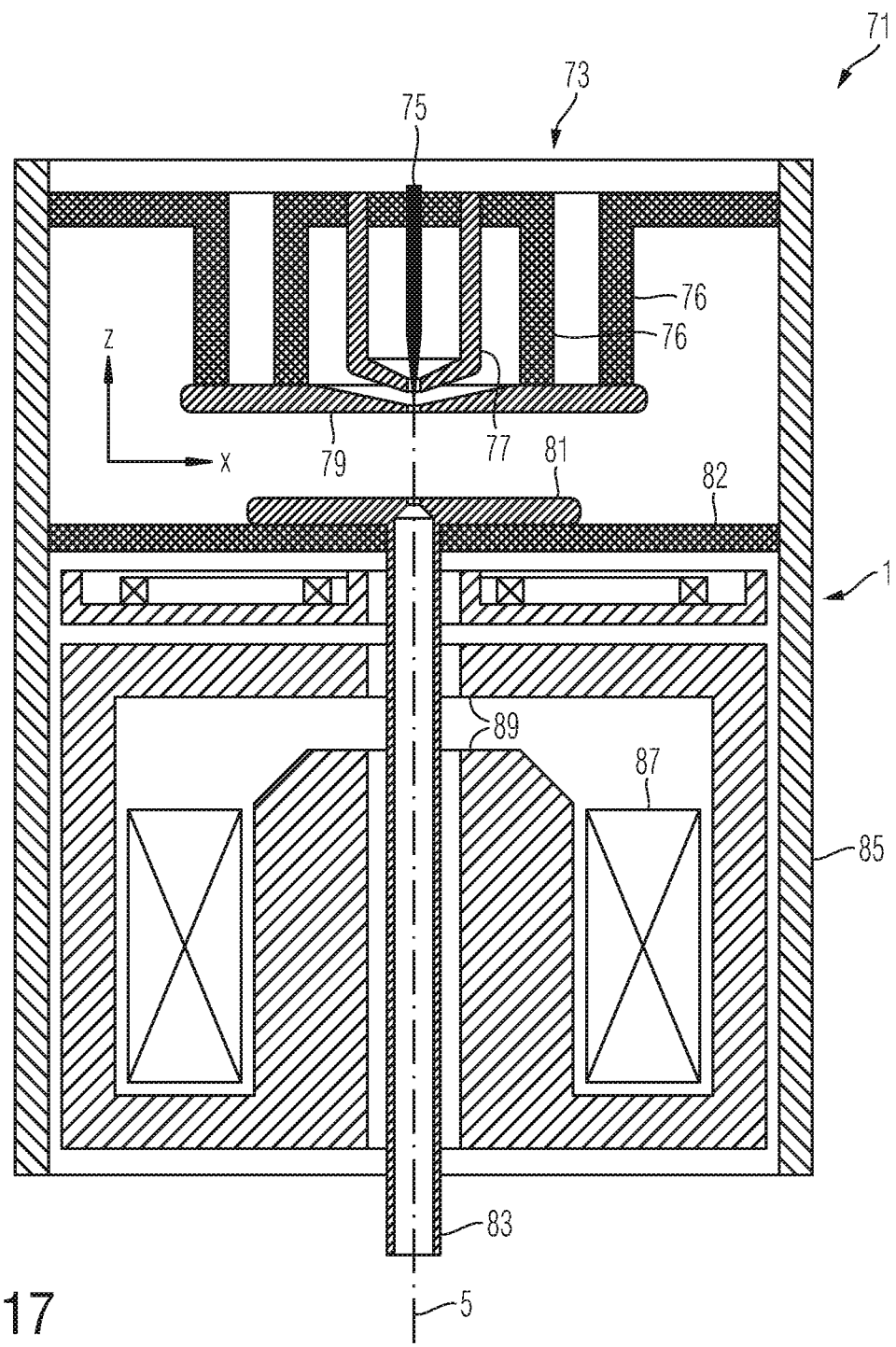
FIG. 17 is a schematic cross-sectional illustration of a particle-optical system according to an embodiment.

FIG. 17 shows a particle-optical system 71 which includes an embodiment of the particle-optical apparatus 1 explained above. The particle-optical system includes a particle source 73 for producing a beam of charged particles which passes through the particle-optical system 71 along a main axis 5. The particle source 73 has a cathode tip 75, a suppressor electrode 77 and an extractor electrode 79. The charged particles emitted by the catheter tip 75 pass through an opening in the extractor electrode 79 and are accelerated towards an anode 81, pass through an opening in the anode 81 and enter into a beam tube 83. Further, the particle-optical apparatus 71 can have e.g. a stage, on which an object can be arranged, the particle beam being directed onto the object after passing through the beam tube 83 and an objective lens.

The elements 75, 77 and 79 are insulated from one another by insulators 76, and the anode 81 is also electrically insulated by an insulator 82 from the rest of the system 71. According to one example, the potential of the catheter tip 75 is −20 kV, the potential of the suppressor electrode 77 is −20.3 kV, the potential of the extractor electrode is −16 kV and the potential of the anode 81 is 8 kV. A voltage supply for supplying these potentials to the various components is not illustrated in FIG. 17. The particle source 73 is arranged in an ultra-high vacuum in order to facilitate a field emission of electrons from the catheter tip 75. In practice, it is difficult to adjust the catheter tip 75, the suppressor electrode 77, extractor electrode 79 and the anode 81 with such great precision in respect of the main axis 5 that the produced particle beam also extends with the desired accuracy along the main axis. Further, it is desirable for the particle beam to pass through the condenser lens 85 centrally on the optical axis thereof in order to reduce the effect of lens aberrations on the focusing of the beam. Therefore, it is desirable to provide a beam deflector between the anode 81 and the condenser lens 85 in order to be able to set the position of the beam relative to the main axis 5.

The particle-optical system illustrated in FIG. 17 further includes a condenser lens 85 for collimating the particle beam produced by the particle source 73. To this end, the condenser lens 85 has a coil body 87 and a pole shoe 89, which are arranged at a distance from one another and which produce a magnetic field which has the effect of a focusing round lens on the particle beam.

Further, it is desirable to arrange the condenser lens 85 as close as possible to the particle source 73 in order to avoid strong widening of the beam upstream of the condenser lens 85. Therefore, an installation space for arranging the deflector, the installation space, in view of its extent along the main axis 5, being comparatively small, is available between the assembly of the condenser lens 85 and the assembly 81 of the anode with associated insulator 82. The particle-optical apparatus 1 explained above can advantageously be introduced into this restricted installation space in order to be used there as a beam deflector for adjusting the particle beam, with the magnetic field produced for the beam deflection acting in the region of the anode 81.

What is claimed is:
1. A particle-optical apparatus, comprising:
 a magnetic-flux-guiding structure having an opening through which a beam axis of the particle-optical apparatus extends; and
 at least two coils of a first type, each having at least one turn,
 wherein:
  the particle-optical apparatus is a beam deflector;
  the coils are arranged at the magnetic-flux-guiding structure; and
  each of the at least two coils of the first type is configured so that, when they are carrying current and other coils of the particle-optical apparatus are not carrying current, each of the at least two coils of the first type produces a deflecting magnetic field, for which the following applies:
   an absolute value of an angle between $\vec{B}_{max}(\vec{r})$ and the beam axis is less than or equal to 60°; and
   $\vec{B}_{max}(\vec{r})$ represents a flux density of the magnetic field at a location outside of the magnetic-flux-guiding structure with coordinates x, y and z, at which an absolute value of the flux density of the magnetic field is maximal.

2. The particle-optical apparatus of claim 1, wherein the magnetic-flux-guiding structure is configured to provide closed flux paths for the magnetic field around the beam axis.

3. The particle-optical apparatus of claim 2, wherein a first group of the flux paths that are closed around the beam axis is arranged at a greater distance from the beam axis than the at least one turn of the at least two coils of the first type.

4. The particle-optical apparatus of claim 3, wherein a second group of the flux paths that are closed around the beam axis is arranged at a lesser distance from the beam axis than the at least one turn of the at least two coils of the first type.

5. The particle-optical apparatus of claim 2, wherein flux paths that are closed around the beam axis and arranged at a lesser distance from the beam axis than the at least one turn of the at least two coils of the first type do not exist.

6. The particle-optical apparatus of claim 1, wherein a surface of the magnetic-flux-guiding structure comprises a plurality of closed surface regions, and the at least one turn of each of the coils of the first type is arranged at such a surface region.

7. The particle-optical apparatus of claim 6, wherein the closed surface region extends toward the beam axis so that an edge of the closed surface region that is arranged closest to the beam axis is arranged closer to the beam axis than the at least one turn of the coil of the first type which is arranged at the closed surface region.

8. The particle-optical apparatus of claim 6, wherein at least one slot in the surface of the magnetic flux guiding structure extends radially to the outside in relation to the beam axis proceeding from the edge that is arranged closest to the beam axis.

9. The particle-optical apparatus of claim 8, wherein the at least one slot extends between two coils of the first type that are adjacent to one another in a circumferential direction around the beam axis.

10. The particle-optical apparatus of claim 1, wherein the at least two coils of the first type are provided are distributed about the beam axis in a circumferential direction.

11. The particle-optical apparatus of claim 1, wherein at least one pair of coils of the first type is configured so that the at least one turn of a first coil of the pair is a shorter distance from the beam axis than the at least one turn of a second coil of the pair.

12. The particle-optical apparatus of claim 1, further comprising at least two coils of a second type, each having at least one turn, the at least two coils of the second type being arranged at the magnetic-field-guiding structure so that that, when each carries current and other coils of the particle-optical apparatus do not carry current, the at least two coils of the second type produce a magnetic field which has field lines that:
successively penetrate the first and the second coil of the second type;
leave the magnetic-flux-guiding structure at a fourth location on a second side in relation to the beam axis;
cross the beam axis at a fifth location;
re-enter the magnetic-flux-guiding structure at a sixth location on the first side of the beam axis; and
extend around the opening from the sixth location to the fourth location within the magnetic-flux-guiding structure; and
wherein the fourth location and the sixth location are each arranged at a distance from the beam axis that is less than a smallest distance of the turns of the coils of the second type from the beam axis.

13. The particle-optical apparatus of claim 12, wherein the fourth location and the sixth location are each arranged at a surface of the magnetic-flux-guiding structure pointing toward the beam axis.

14. The particle-optical apparatus of claim 12, further comprising a power supply system configured to respectively supply a first and second coil of the first type with an adjustable first current and to respectively supply a first and the second coil of the second type with an adjustable second current.

15. The particle-optical apparatus of claim 14, wherein the power supply system comprises a power source configured to supply a single adjustable current providing the first and the second current, and a ratio of the first current to the second current is adjustable via at least one changeable resistor.

16. The particle-optical apparatus of claim 1, wherein the magnetic-flux-guiding structure comprises a metallic plate element carrying one or more of the at least two coils of the first type.

17. The particle-optical apparatus of claim 1, further comprising a power supply system, wherein:
the at least two coils of the first type comprise first and second flat coils opposite one another on the magnetic-flux-guiding structure in a substantially symmetric manner relative to the opening; and
the power supply system is configured to supply the first and second flat coils with current so that the magnetic fields produced by the first and second flat coils are oriented in mutually opposite directions.

18. The particle-optical apparatus of claim 17, wherein the first and the second flat coils are substantially symmetric in relation to one another.

19. The particle-optical apparatus of claim 17, wherein each of the first and the second flat coils is a cylinder coil with a coil diameter and coil length with the coil diameter being greater than the coil length thereof.

20. The particle-optical apparatus of claim 17, wherein the turns of the first and the second flat coils lie in a plane that has an orthogonal orientation to the beam axis.

21. A system, comprising:
a source configured to produce a particle beam; and
a particle-optical apparatus according to claim 1.

22. The system of claim 21, wherein the particle source comprises an electron source and/or an ion source.

23. The particle-optical apparatus of claim 1, wherein:
when the at least two coils carry current and other coils of the particle-optical apparatus do not carry current, the at least two coils produce a magnetic deflection field ($B_1$) on the beam axis;
a maximum distance ($r_{max}$) of the turns from the beam axis is a first distance;
a magnetic flux density of the magnetic field has a maximum of its absolute value along the beam axis;
the maximum is arranged at a location ($z_m$) along the beam axis which has a second distance ($z_m - z_s$) from the turns along the beam axis; and
the second distance is at least 0.02 times as large as the first distance.

24. The particle-optical apparatus of claim 1, wherein:
when the at least two coils of the first type carry current and other coils of the particle-optical apparatus do not carry current, the at least two coils of the first type produce a magnetic deflection field ($B_1$) on the beam axis, which has a centroid on the beam axis at a location $z_0$;

each of the at least two coils respectively has a center of mass at a location $\vec{r}_0$;

a ratio between a distance of the location from a connecting line between the two locations $\vec{r}_0$ and a distance of the two locations $\vec{r}_0$ from one another is greater than 0.1;

$$z_0 = \frac{\int_{z_{min}}^{z_{max}} z B_\perp(z)dz}{\int_{z_{min}}^{z_{max}} B_\perp(z)dz};$$

where integration is carried out along the beam axis extending in the z-direction, $R_1(z)$ is the component of the magnetic field ($R_1$) on the beam axis oriented orthogonal to the beam axis and $z_{min}$ and $z_{max}$ are locations on the beam axis and delimit a region thereon, in which the values of $B_1(z)$ are greater than 0.01 times the maximum value of $B_1(z)$;

$$\vec{r}_0 = \underset{\vec{r}_s}{\operatorname{argmax}} \left| \int_0^L \frac{\vec{r} - \vec{r}_s}{|\vec{r} - \vec{r}_s|^3} \times \vec{dl} \right|;$$

where integration is carried out along the current carrier forming the respective coil over the length L thereof, $\vec{r}$ are the locations on the centre line of the current carrier forming the coil and $\vec{r}_s$ are locations in space.

25. The particle-optical apparatus of claim 1, wherein the at least two coils of the first type are configured to generate magnetic fields which are oriented transversely to the beam axis.

* * * * *